United States Patent
Harada et al.

(10) Patent No.: US 9,029,843 B2
(45) Date of Patent: May 12, 2015

(54) ORGANIC ELECTROLUMINESCENCE ELEMENT

(71) Applicant: Panasonic Corporation, Osaka (JP)

(72) Inventors: Kenji Harada, Hyogo (JP); Seiji Nishiyama, Osaka (JP); Takahiro Komatsu, Osaka (JP); Takayuki Takeuchi, Hyogo (JP); Satoru Ohuchi, Osaka (JP); Yoshiaki Tsukamoto, Osaka (JP); Shinya Fujimura, Osaka (JP); Kei Sakanoue, Fukuoka (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 13/746,485

(22) Filed: Jan. 22, 2013

(65) Prior Publication Data

US 2013/0134403 A1 May 30, 2013

Related U.S. Application Data

(63) Continuation of application No. PCT/JP2010/004993, filed on Aug. 6, 2010.

(51) Int. Cl.
*H01L 51/50* (2006.01)
*H01L 51/52* (2006.01)

(52) U.S. Cl.
CPC ........ *H01L 51/5088* (2013.01); *H01L 51/5209* (2013.01); *H01L 51/5218* (2013.01); *H01L 2251/5369* (2013.01)

(58) Field of Classification Search
CPC ............ H01L 51/0036; H01L 51/0545; H01L 51/5088
USPC .............................................. 257/40; 438/47
See application file for complete search history.

(56) References Cited

U.S. PATENT DOCUMENTS 5,294,869 A 3/1994 Tang et al.
5,443,922 A 8/1995 Nishizaki et al.
(Continued)

FOREIGN PATENT DOCUMENTS

CN 1426894 7/2003
CN 101170124 4/2008
(Continued)

OTHER PUBLICATIONS

Meyer et al., Charge generation layers comprising transition metal-oxide/organic interfaces: Electronic structure and charge generation mechanism, May 10, 2010, Applied Physics Lettters, 96, pp. 1-3.*
(Continued)

*Primary Examiner* — Matthew W Such
*Assistant Examiner* — Warren H Kilpatrick
(74) *Attorney, Agent, or Firm* — Greenblum & Bernstein, P.L.C.

(57) ABSTRACT

An organic light-emitting element comprising: an anode; a cathode; banks; a functional layer between the anode and the cathode; and a hole injection layer between the anode and the functional layer. The functional layer includes one or more sublayers including a light-emitting sublayer defined by the banks and that contains an organic material. The hole injection layer comprises tungsten oxide, includes an occupied energy level that is approximately 1.8 electron volts to approximately 3.6 electron volts lower than a lowest energy level of a valence band of the hole injection layer in terms of a binding energy, has a surface facing the functional layer, and has a recessed structure such that a portion of the surface overlapping with the light-emitting sublayer is located closer to the anode than other portions. The recessed structure has a recessed portion whose inner surface is in contact with the functional layer.

19 Claims, 25 Drawing Sheets

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 7,785,718 B2 | 8/2010 | Yatsunami et al. |
| 8,058,797 B2 | 11/2011 | Frey et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0075385 A1 | 4/2004 | Tao |
| 2004/0178414 A1 | 9/2004 | Frey et al. |
| 2005/0064633 A1 | 3/2005 | Mikoshiba |
| 2005/0073243 A1 | 4/2005 | Yamazaki et al. |
| 2005/0170208 A1 | 8/2005 | Yatsunami et al. |
| 2005/0208206 A1 | 9/2005 | Yoshikawa |
| 2005/0266763 A1* | 12/2005 | Kimura et al. .................. 445/24 |
| 2006/0008931 A1 | 1/2006 | Lee et al. |
| 2006/0181583 A1 | 8/2006 | Usuda |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0034864 A1 | 2/2007 | Liu |
| 2007/0092981 A1 | 4/2007 | Jung et al. |
| 2007/0148333 A1 | 6/2007 | Morimoto |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0063949 A1 | 3/2008 | Inoue |
| 2008/0100209 A1 | 5/2008 | Ito |
| 2008/0150422 A1 | 6/2008 | Ohara |
| 2008/0231179 A1 | 9/2008 | Abe et al. |
| 2008/0312437 A1 | 12/2008 | Inoue et al. |
| 2009/0058268 A1 | 3/2009 | Yoshida et al. |
| 2009/0115318 A1 | 5/2009 | Gregory et al. |
| 2009/0160325 A1 | 6/2009 | Yatsunami et al. |
| 2009/0200917 A1 | 8/2009 | Yamagata et al. |
| 2009/0224664 A1 | 9/2009 | Yoshida et al. |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2009/0284146 A1 | 11/2009 | Yoshida et al. |
| 2010/0084672 A1 | 4/2010 | Ueno et al. |
| 2010/0102310 A1 | 4/2010 | Komatsu et al. |
| 2010/0181554 A1* | 7/2010 | Yoshida et al. .................. 257/40 |
| 2010/0213827 A1 | 8/2010 | Yoshida et al. |
| 2010/0252857 A1 | 10/2010 | Yoshida |
| 2010/0258833 A1 | 10/2010 | Okumoto et al. |
| 2010/0302221 A1 | 12/2010 | Okumoto |
| 2011/0037065 A1 | 2/2011 | Ueno et al. |
| 2011/0037068 A1* | 2/2011 | Yamazaki et al. .................. 257/43 |
| 2011/0042703 A1 | 2/2011 | Okumoto et al. |
| 2011/0140091 A1 | 6/2011 | Friend et al. |
| 2011/0140596 A1 | 6/2011 | Yoshida et al. |
| 2011/0180821 A1 | 7/2011 | Matsushima |
| 2011/0198623 A1 | 8/2011 | Matsushima |
| 2011/0198624 A1 | 8/2011 | Matsushima |
| 2011/0204410 A1 | 8/2011 | Yada |
| 2012/0061656 A1 | 3/2012 | Ohuchi et al. |
| 2012/0132934 A1 | 5/2012 | Ohuchi et al. |
| 2012/0132935 A1 | 5/2012 | Isobe et al. |
| 2012/0178191 A1 | 7/2012 | Sakanoue et al. |
| 2013/0126841 A1 | 5/2013 | Nishiyama et al. |

FOREIGN PATENT DOCUMENTS

| | | |
|---|---|---|
| EP | 2175504 | 4/2010 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2004/036663 | 4/2004 |
| WO | 2007/037358 | 4/2007 |
| WO | 2008/120714 A1 | 10/2008 |
| WO | 2008/149498 A1 | 12/2008 |
| WO | 2008/149499 A1 | 12/2008 |
| WO | WO 2009/107323 * | 3/2009 .................. 257/40 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

(56) References Cited

OTHER PUBLICATIONS

Tungsten Trioxide, Wikipedia, The Free Encyclopedia, available at http://en.wikipedia.org/wiki/Tungsten(VI)_oxide, accessed Jan. 10, 2014.

Tungsten Oxide, McGraw-Hill Dictionary of Scientific and Technical Terms, McGraw-Hill Book Company, Fourth Edition, p. 1979, left column, date stamped Feb. 28, 1989.

Tungsten Oxide, Iwanami Rikagaku Jiten, Iwanami Shoten, Publishers, Fifth Edition, p. 533, left column, line 42 to right column, line 19, dated Feb. 20, 1998, together with an English language translation thereof.

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

U.S. Appl. No. 13/205,778 to Kenji Harada et al., filed Aug. 9, 2011.
U.S. Appl. No. 13/298,528 to Satoru Ohuchi et al., filed Nov. 27, 2011.
U.S. Appl. No. 13/739,363 to Seiji Nishiyama et al., filed Jan. 11, 2013.
U.S. Appl. No. 13/742,575 to Kenji Harada et al., filed Jan. 16, 2013.
U.S. Appl. No. 13/742,600 to Kenji Harada et al., filed Jan. 16, 2013.
U.S. Appl. No. 13/721,202 to Kenji Harada et al., filed Dec. 20, 2012.
U.S. Appl. No. 13/742,593 to Kenji Harada et al., filed Jan. 16, 2013.
Extended European Search Report (EESR) in European Patent Application No. 10741077.1, dated Feb. 11, 2013.

International Search Report in PCT/JP2010/000783, dated Apr. 6, 2010.
International Search Report in PCT/JP2010/004471, dated Oct. 5, 2010.
International Search Report in PCT/JP2010/004987, dated Sep. 7, 2010.
International Search Report in PCT/JP2010/004993, dated Sep. 7, 2010.
International Search Report in PCT/JP2010/004954, dated Sep. 7, 2010.
International Search Report in PCT/JP2010/004992, dated Nov. 16, 2010.
International Search Report in PCT/JP2010/004956, dated Sep. 7, 2010.
International Search Report in PCT/JP2010/004989, dated Sep. 7, 2010.
International Search Report in PCT/JP2011/000324, dated Feb. 22, 2011.
International Search Report in PCT/JP2012/000288, dated Apr. 17, 2012.
United States Office Action in U.S. Appl. No. 13/742,575, dated Mar. 14, 2014.

Meyer et al., "Charge generation layers comprising transition metal-oxide/organic interfaces: Electronic structure and charge generation mechanism", Applied Physics Letters, 96, 193302, pp. 1-3 (May 2010).

Elam et al., "Nucleation and growth during tungsten atomic layer deposition on $SiO_2$ surfaces", Thin Solid Films, 386, pp. 41-52 (2001).

Ramana et al., "Electron microscopy investigation of structural transformation in tungsten oxide (WO3) thin films", Physica Status Solidi (a) 202, No. 10, pp. R108-R110 (Jul. 6, 2005).

Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).

United States Office Action in U.S. Appl. No. 13/742,593, dated Apr. 3, 2014.
United States Office Action in U.S. Appl. No. 13/742,600, dated Apr. 14, 2014.
China Office Action from State Intellectual Property Office (SIPO) in Chinese Patent Application No. 201080007063.X, dated Mar. 18, 2014, together with an English language Search Report.
China Office Action from State Intellectual Property Office (SIPO) in Chinese Patent Application No. 201080019186.5, dated Apr. 3, 2014, together with a partial English language translation.

Dinesh Kabra et al., "High Efficiency Composite Metal Oxide-Polymer Electroluminescent Devices: A Morphological and Material Based Investigation", Advanced Materials, vol. 20, Issue 18, pp. 3447-3452 (2008).

United States Office Action in U.S. Appl. No. 13/298,528, dated Jan. 14, 2014.
United States Office Action in U.S. Appl. No. 13/994,164, dated Jun. 5, 2014.
United States Notice of Allowance in U.S. Appl. No. 13/995,205, dated May 13, 2014.
United States Office Action in U.S. Appl. No. 13/205,778, dated Jun. 16, 2014.
China Office Action from State Intellectual Property Office (SIPO) in Chinese Patent Application No. 201080007063.X, dated Jul. 25, 2013, together with a partial English language translation.
European Office Action in European Patent Application No. 10741077.1, dated Dec. 2, 2013.
United States Office Action in U.S. Appl. No. 13/298,528, dated Jan. 11, 2013.
United States Office Action in U.S. Appl. No. 13/205,778, dated Nov. 13, 2013.
United States Office Action in U.S. Appl. No. 13/298,528, dated May 17, 2013.
Japan Office Action in Japanese Patent Application No. 2009-189658, dated Apr. 8, 2013.

(56) References Cited

OTHER PUBLICATIONS

Stella Tsuushin (Stella communication), Stella Corporation, undated, available at http://www.stellacorp.co.jp/media/conference#past/0902sorst.html, accessed on Apr. 8, 2013, together with a partial English language translation.

L. Chkoda et al., "Work function of ITO substrates and band-offsets at the TPD/ITO interface determined by photoelectron spectroscopy", Synthetic metals 111-112, pp. 315-319 (2000).

U.S. Appl. No. 13/994,164 to Satoru Ohuchi et al., filed Jun. 14, 2013.
U.S. Appl. No. 13/995,205 to Takahiro Komatsu et al., filed Jun. 18, 2013.

* cited by examiner

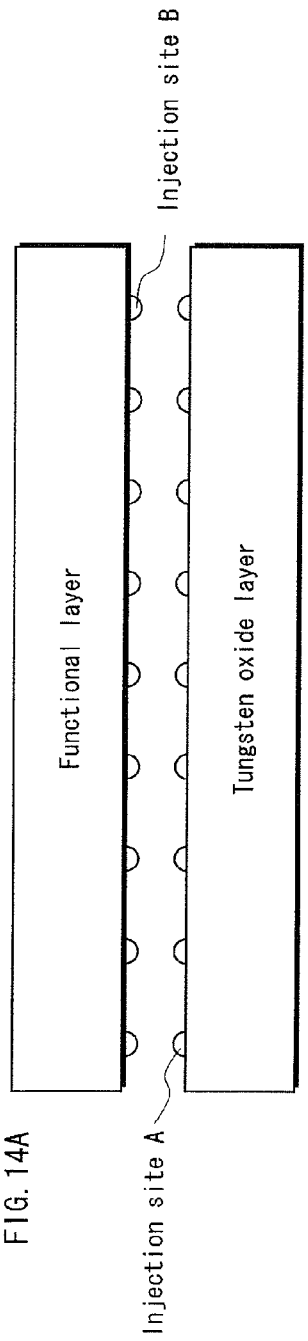
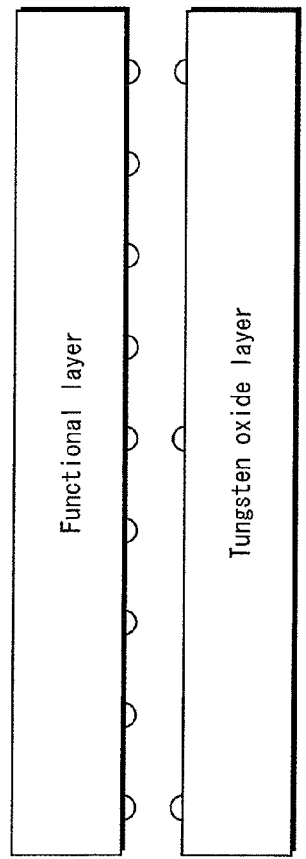
FIG. 14A (A: a case where an appropriate number of injection sites exists in the tungsten oxide layer)
FIG. 14B (B, C: a case where there are no injection sites in the tungsten oxide layer and a case where there is a shortage of injection sites in the tungsten oxide layer)

ORGANIC ELECTROLUMINESCENCE ELEMENT

CROSS REFERENCE TO RELATED APPLICATION

This is a continuation application of PCT Application No. PCT/JP2010/004993 filed Aug. 6, 2010, designating the United States of America, the disclosure of which, including the specification, drawings and claims, is incorporated herein by reference in its entirety.

TECHNICAL FIELD

The present disclosure relates to an organic electric-field light-emitting element (referred to hereinafter as an "organic EL element"), which is an electric light-emitting element. Particularly, the present disclosure relates to a technology for driving such an organic EL element at low electricity while ensuring a wide range of luminous intensity from low luminous intensity to high luminous intensity for the use as a light source or the like.

DESCRIPTION OF THE RELATED ART

In recent years, progress is being made in research and development of diverse functional elements which involve the use of an organic semiconductor.

Organic EL elements are known as being one of the most common among such functional elements. An organic EL element is a current-driven light-emitting element, and commonly includes a pair of electrodes consisting of an anode and a cathode, and a functional layer containing organic material disposed between the pair of electrodes. The functional layer includes layers such as a light-emitting layer and a buffer layer. Further, there are cases where a hole injection layer is disposed between the functional layer and the anode. The hole injection layer is disposed for injecting holes to the functional layer. When driving the organic EL element, voltage is applied between the pair of electrodes. The emission of light from the organic EL element is caused by an electric-field light-emitting phenomenon taking place as a result of the recombination of holes which are injected from the anode to the functional layer, and the electrons which are injected from the cathode to the functional layer. Now, more attention is being given to the application of organic EL elements as a light-emitting element or a light source for various display devices. This owes to the advantageous characteristics of the organic EL element, which include: high visibility resulting from self-luminescence; and excellent shock resistance resulting from the fully solid-state structure thereof.

Organic EL elements can be largely divided into two types, according to the material used for forming the functional layer therein. The first type of organic EL elements is a vapor deposition type. A vapor deposition-type organic EL element has a functional layer that is mainly composed of low molecular material and that is formed as a film by applying a vacuum process such as a vapor deposition method. The second type of organic EL elements is an application type. An application-type organic EL element has a functional layer that is mainly composed of either high molecular material, or low molecular material having an excellent thin film forming property, and that is formed as a film by applying a wet process such as the inkjet method and a gravure printing method.

When comparing the two types of organic EL elements, vapor deposition-type organic EL elements have gained more popularity up to this point, for reasons such as higher light-emitting efficiency of the light-emitting material and longer operating lifetime in comparison with application-type organic EL elements (for example, refer to Patent Literatures 1 and 2). As a result, vapor deposition-type organic EL elements have already been put into practical use in mobile phone displays, small-sized TVs and the like.

However, although vapor deposition-type organic EL elements may be ideal for use in small-sized organic EL panels, application thereof is extremely difficult, for example, to full-color, large-sized organic EL panels having display sizes of around 100 inches. The difficulty of such an application derives from the technology applied in the manufacturing of a vapor deposition-type organic EL element. For instance, when manufacturing an organic EL panel using vapor deposition-type organic EL elements, a mask vapor deposition method is commonly applied for separately forming light-emitting layers corresponding to each of the colors (for example R, G, and B) to be displayed on the organic EL panel. However, as the surface area of the organic EL panel to be manufactured becomes larger, it becomes more and more difficult to maintain the precision with which mask position adjustment is performed. This is due to reasons such as the difference in thermal expansion coefficients between the mask and the glass substrate. Hence, the manufacturing of a large-sized display without any deficiencies is extremely difficult when applying vapor deposition-type organic EL elements. One possible countermeasure as to overcome such a problem is using vapor deposition-type organic EL elements having a light-emitting layer formed of white-colored material, and further providing color filters of the respective colors R, G, and B. This excludes the need for the separate application of colors, but however, such a countermeasure has a shortcoming as well. In specific, when taking such a countermeasure, the amount of light which can be actually used is a mere third of the amount of light emitted from the entire light-emitting layer, and thus, more electricity will be consumed, in principle.

As such, attempts are being made to realize the manufacturing of larger organic EL panels by using application-type organic EL elements. As already described in the above, a functional layer is formed by applying a wet process in an application-type organic EL element. In the application of the wet process, the precision with which the application of functional layer material of the respective colors to corresponding positions on the substrate is performed is not influenced by the size of the substrate. Hence, the technical barrier to be overcome in realizing the manufacturing of larger organic EL panels is not as high as in the case of vapor deposition-type organic EL elements.

At the same time, much effort is also being made in research and development of technology for enhancing the light-emitting efficiency of organic EL elements. Efficient injection of carriers (holes and electrons) from the electrodes to the functional layer is essential in causing an organic EL element to emit light with high efficiency, high luminous intensity, and low electrical consumption. Generally, provision of an injection layer in between each of the electrodes and the functional layer is effective in realizing efficient injection of carriers to the functional layer. This is since an injection layer has the function of lowering the energy barrier to be overcome in the injection of carriers. As a hole injection layer, which is one of the injection layers, such films as a vapor deposition film and an application film are commonly used. A vapor deposition film is composed of material such as copper phthalocyanine and molybdenum oxide, whereas an application film is composed of PEDOT or the like. Among such hole injection layers, it has been reported that a vapor deposition film composed of molybdenum oxide contributes to the improvement of hole injection efficiency, as well as to the longevity of the organic EL element (for example, refer to Patent Literature 3).

CITATION LIST

Patent Literature

[Patent Literature 1]
  Japanese Patent Publication No. 3369615
[Patent Literature 2]
  Japanese Patent Publication No. 3789991
[Patent Literature 3]
  Japanese Patent Application Publication No. 2005-203339
[Patent Literature 4]
  Japanese Patent Application Publication No. 2003-249375

Non-Patent Literature

[Non-Patent Literature 1]
  Jingze Li et al., Synthetic Metals 151, 141 (2005)
[Non-Patent Literature 2]
  Hiromi Watanabe et al., Yuki E L Tohronkai Dai 7 Kai Reikai Yokoushuu, 17 (2008)
[Non-Patent Literature 3]
  Hyunbok Lee et al., Applied Physics Letters 93, 043308 (2008)
[Non-Patent Literature 4]
  Kenji Koizumi et al., Dai 56 Kai Ouyou Butsurigaku Kankei Rengou Kouenkai Yokoushuu, 30p-ZA-11 (2009)
[Non-Patent Literature 5]
  Yasuo Nakayama et al., Yuki E L Tohronkai Dai 7 Kai Reikai Yokoushuu, 5 (2008)

SUMMARY

However, although application-type organic EL elements have such advantageous features as described above, there is a demand to improve application-type organic EL elements so as to further enhance low-voltage drive characteristics and light emitting efficiency of application-type organic EL elements. In particular, in the manufacturing of application-type organic EL elements, there is a demand to further improve hole injection efficiency of application-type organic EL elements and to provide application-type organic EL elements with a further enhanced level of longevity.

In view of such problems, one non-limiting and exemplary embodiment provides an organic EL element which has a reduced hole injection barrier between the hole injection layer and the functional layer and which realizes excellent hole injection efficiency. As such, the organic EL element pertaining to the present disclosure is expected to drive in excellent state under low voltage.

In one general aspect, the techniques disclosed here feature an organic light-emitting element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, the hole injection layer includes an occupied energy level that is approximately 1.8 electron volts to approximately 3.6 electron volts lower than a lowest energy level of a valence band of the hole injection layer in terms of a binding energy, the hole injection layer has a surface facing the functional layer and has a recessed structure such that a portion of the surface overlapping with the light-emitting sublayer is located closer to the anode than other portions of the surface, and the recessed structure has a recessed portion whose inner surface is in contact with the functional layer.

In the organic EL element pertaining to one aspect of the present invention, the hole injection layer contains tungsten oxide. Further, the hole injection layer has, in an electronic state thereof, an occupied energy level which is 1.8 eV to 3.6 eV lower than the lowest energy level of a valence band of the hole injection layer, in terms of binding energy. By the hole injection layer having such an occupied energy level, the hole injection barrier between the hole injection layer and the functional layer is suppressed to a low level. Resultantly, the organic EL element pertaining to one aspect of the present invention has excellent hole injection efficiency, can be driven at a low voltage, and is expected to exhibit excellent light-emitting efficiency.

Here, it is to be noted that, when the hole injection layer contains tungsten oxide having such a predetermined occupied energy level as described above, a previously-unknown, unique situation arises where a film thickness of the hole injection layer decreases in the manufacturing process (hereinafter also referred to as "film thickness reduction"). Such a situation is problematic, giving rise to a risk of the light-emitting characteristics of the organic EL element being affected for reasons such as ununiform luminous intensity of a light-emitting portion within a region defined by banks and a shortened life-span of the organic EL element.

In view of such problems, in the organic EL element pertaining to one aspect of the present invention, the hole injection layer has a recessed structure such that a portion of a surface thereof facing the functional layer is closer to the anode than other portions of the surface facing the functional layer. In addition, in the organic EL element pertaining to one aspect of the present invention, an inner surface (an inner bottom surface and an inner side surface) of a recessed portion of the hole injection layer is in contact with the functional layer. Due to this, the wettability of the functional layer with respect to the hole injection layer is improved. As such, even when the film thickness reduction of the hole injection layer occurs, material for forming the functional layer is prevented from being applied ununiformly, and accordingly, an organic EL element having excellent characteristics is formed by patterning being performed with high precision. As a result, the risk of the light-emitting characteristics of the organic EL element being affected can be reduced preemptively by preventing problems such as ununiform luminous intensity and reduction in life-span from occurring.

These general and specific aspects may be implemented using an organic light-emitting element, a display device, and a manufacturing method for an organic light-emitting element.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 14A and 14B are diagrams for explanation of effects yielded by injection sites of the hole injection layer and a functional layer.

FIG. 28 is a perspective view illustrating a display apparatus pertaining to embodiment 5 of the present disclosure and the like.

DETAILED DESCRIPTION

Figure 1:
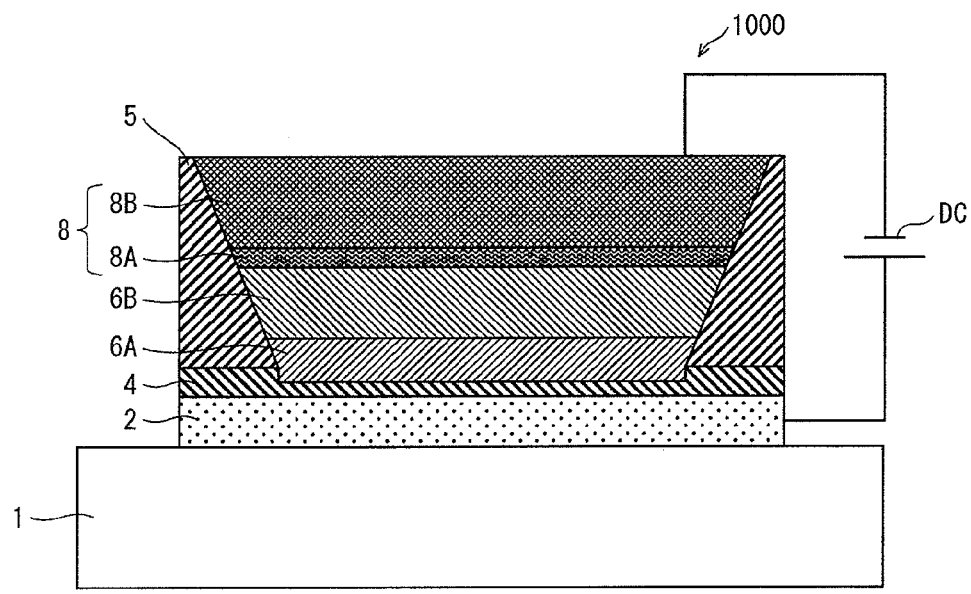
FIG. 1 is a schematic cross-sectional view illustrating a structure of an organic EL element pertaining to an embodiment of the present disclosure.

One aspect of the present invention is an organic light-emitting element comprising: an anode; a cathode; banks; a functional layer between the anode and the cathode, the functional layer including one or more sublayers, the one or more sublayers including a light-emitting sublayer, the light-emitting sublayer defined by the banks and containing an organic material; and a hole injection layer between the anode and the functional layer, wherein the hole injection layer comprises tungsten oxide, the hole injection layer includes an occupied energy level that is approximately 1.8 electron volts to approximately 3.6 electron volts lower than a lowest energy level of a valence band of the hole injection layer in teims of a binding energy, the hole injection layer has a surface facing the functional layer and has a recessed structure such that a portion of the surface overlapping with the light-emitting sublayer is located closer to the anode than other portions of the surface, and the recessed structure has a recessed portion whose inner surface is in contact with the functional layer.

In the organic EL element, the occupied energy level at an interface between the hole injection layer and the functional layer may be approximately equal to an energy level of a highest occupied molecular orbital of the functional layer in teens of the binding energy.

In the organic EL element, a gap between the occupied energy level at an interface between the hole injection layer and the functional layer and an energy level of a highest occupied molecular orbital of the functional layer may be at most approximately 0.3 electron volts in teens of the binding energy.

In the organic EL element, an ultraviolet photoelectron spectroscopy spectrum of the hole injection layer may exhibit an upward protrusion that is approximately 1.8 electron volts to approximately 3.6 electron volts lower than the lowest energy level of the valence band in terms of the binding energy.

In the organic EL element, an X-ray photoelectron spectroscopy spectrum of the hole injection layer may exhibit an upward protrusion that is approximately 1.8 electron volts to approximately 3.6 electron volts lower than the lowest energy level of the valence band in terms of the binding energy.

In the organic EL element, a differential spectrum obtained by differentiating an ultraviolet photoelectron spectroscopy spectrum of the hole injection layer may have a shape that is expressed by a non-exponential function throughout a range between approximately 2.0 electron volts and approximately 3.2 electron volts lower than the lowest energy level of the valence band in terms of the binding energy.

In the organic EL element, the functional layer may comprise an amine-containing material.

In the organic EL element, the light-emitting sublayer may emit light by recombination of electrons and holes injected thereto, and the functional layer may further include either one or both of a hole transfer sublayer that transfers holes and a buffer sublayer that adjusts optical characteristics of the organic light-emitting element and/or blocks electrons.

In the organic EL element, the occupied energy level may be approximately 2.0 electron volts to 3.2 electron volts lower than the lowest energy level of the valence band in terms of the binding energy.

In the organic EL element, the banks may be liquid-repellent and the hole injection layer may be liquid-philic. Note that here, the terms "liquid-philic" and "liquid-phobic" are each used in a relative sense. As described above, the banks are liquid-phobic at least at surfaces thereof. On the other hand, when the charge injection transport layer is principally composed of a metal compound with liquid-philicity, a surface of the charge injection transport layer is more liquid-philic than the surfaces of the banks, and the surfaces of the banks are more liquid-phobic than the surface of the charge injection transport layer. Also, the surface of the charge injection transport layer having liquid-philicity has high relative wettability to ink, and the surfaces of the banks having liquid-repellency have low relative wettability to the ink. Note that, liquid-philicity or liquid-repellency can be, for example, defined by a contact angle at which the ink meets the surfaces of the banks or the surface of the charge injection transport layer. For example, when the contact angle is equal to or smaller than 10°, the surfaces are defined as having liquid-philicity, whereas when the contact surface is equal to or greater than 35°, the surfaces are defined to have liquid-repellency.

A display device pertaining to one aspect of the present invention may comprise the above-described organic EL element.

One aspect of the present invention is a manufacturing method for an organic light-emitting element, comprising: an anode preparation step of preparing an anode; a tungsten oxide layer forming step of forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$; a bank forming step of forming banks above the tungsten oxide layer by forming a resist film including resist material above the tungsten oxide layer and etching the resist film with a developing solution; a hole injection layer forming step, subsequent to the bank forming step, of forming a hole injection layer by (i) cleaning, with a cleaning fluid, a surface of the tungsten oxide layer and thereby removing residuals of the resist film adhering to the surface of the tungsten oxide layer and (ii) dissolving a part of the tungsten oxide layer with the cleaning fluid, the hole injection layer formed such that a portion of an upper surface of the hole injection layer facing the functional layer is located closer to the anode than other portions of the upper surface, the portion forming a recessed portion composed of an inner bottom surface and an inner side surface that is continuous with the inner bottom surface; a functional layer forming step of forming a functional layer by depositing ink into a region of the hole injection layer defined by the banks, applying the ink with respect to the inner bottom surface and the inner side surface such that the ink is in contact with the inner bottom surface and the inner side surface, and drying the ink; and a cathode forming step of forming a cathode above the functional layer.

One aspect of the present invention is a manufacturing method for an organic light-emitting element, comprising: an anode preparation step of preparing an anode; a tungsten oxide layer forming step of forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$; a hole injection layer forming step of, while forming banks above the tungsten oxide layer by forming a resist film including resist material above the tungsten oxide layer and etching the resist film with a developing solution, forming a hole injection layer by (i) cleaning, with the developing solution, a surface of the tungsten oxide layer and thereby removing residuals of the resist film adhering to the surface of the tungsten oxide layer and (ii) dissolving a part of the tungsten oxide layer with the developing solution, the hole injection layer formed such that a portion of an upper surface of the hole injection layer facing the functional layer is located closer to the anode than other portions of the upper surface, the portion forming a recessed portion composed of an inner bottom surface and an inner side surface that is continuous with the inner bottom surface; a functional layer forming step of forming a functional layer by depositing ink into a region of the hole injection layer defined by the banks, applying the ink with respect to the inner bottom surface and the inner side surface such that the ink is in contact with the inner bottom surface and the inner side surface, and drying the ink; and a cathode forming step of forming a cathode above the functional layer.

Here, the expression "a resist film including resist material" indicates "a resist film including resist material as bank material, which is formed as a bank film".

In the manufacturing method, in the tungsten oxide layer forming step, the tungsten oxide layer may be formed such that an ultraviolet photoelectron spectroscopy spectrum of the tungsten oxide layer exhibits an upward protrusion that is approximately 1.8 electron volts to approximately 3.6 electron volts lower than a lowest energy level of a valence band of the tungsten oxide layer in terms of a binding energy.

In the manufacturing method, in the tungsten oxide layer forming step, the tungsten oxide layer may be formed such that a differential spectrum, obtained by differentiating an ultraviolet photoelectron spectroscopy spectrum of the tungsten oxide layer, exhibits a shape that is expressed by a non-exponential function throughout a range between approximately 2.0 electron volts and approximately 3.2 electron volts lower than a lowest energy level of a valence band of the tungsten oxide layer in terms of a binding energy.

In the following, description is provided on an organic EL element pertaining to an embodiment of the present disclosure. Subsequently, results and observations will be presented for each of the experiments having been performed to assess the efficiency of the invention as disclosed in the present disclosure.

It is to be noted that, in each of the accompanying figures, the relation between sizes of each of the members are not illustrated directly reflecting the actual relation.

<Embodiment 1>
(Structure of Organic EL Element)

FIG. 1 is a schematic cross-sectional view illustrating the structure of an organic EL element 1000 pertaining to the present embodiment.

The organic EL element 1000 is an application-type organic EL element, which is characterized in that a functional layer is applied by a wet process in the manufacturing thereof. The organic EL element 1000 includes: a hole injection layer 4; a functional layer including various layers (a buffer layer 6A and a light-emitting layer 6B, in this case); and a pair of electrodes composed of an anode 2 and a cathode 8. The hole injection layer 4 and the functional layer are disposed one on top of the other, and are disposed between the pair of electrodes. Each layer of the functional layer contains organic material having a predetermined function.

More specifically, the organic EL element 1000 includes, as illustrated in FIG. 1, the anode 2, the hole injection layer 4, the buffer layer 6A, the light-emitting layer 6B, and the cathode 8 (composed of a barium layer 8A and an aluminum layer 8B), which are disposed in the stated order on one main surface of a substrate 1.

The substrate 1 is formed with an insulating material such as soda glass, nonfluorescent glass, phosphate glass, borate glass, quartz, acrylic resin, styrenic resin, polycarbonate resin, epoxy resin, polyethylene, polyester, silicone resin, alumina, etc. Further, the substrate 1 has a predetermined TFT wiring formed on one surface thereof.

The anode 2 may be formed, for example, with APC (alloy of silver, palladium, and copper), ARA (alloy of silver, rubidium, and gold), MoCr (alloy of molybdenum and chromium), NiCr (alloy of nickel and chromium), etc. In the case of a top emission type light-emitting element, for example, the anode 2 may be formed with a light-reflective material.

(Hole Injection Layer)

The hole injection layer 4 is composed of a 30 nm-thick tungsten oxide thin film (layer). In the composition formula (WOx) denoting the composition of tungsten oxide, x is a real number existing within a range of approximately $2<x<3$.

Concerning the hole injection layer 4, for example, the hole injection layer 4 may consist of only tungsten oxide. However, the inclusion of a trace level of impurities is acceptable, provided that the amount does not exceed the amount of impurities which may be incorporated as a result of normal processing.

Here, the hole injection layer 4 is formed under specific conditions. It is by forming the hole injection layer 4 under such specific conditions that the hole injection layer is provided, in an electronic state thereof, with an occupied energy level which is 1.8 eV to 3.6 eV lower than an upper end of the valence band of the hole injection layer 4, which corresponds to the lowest energy level of the valence band, in terms of binding energy. This occupied energy level of the hole injection layer 4 corresponds to the energy level of the highest occupied molecular orbital (HOMO) of the hole injection layer 4. That is, in the electronic state of the hole injection layer 4, the occupied energy level is closest to the Fermi surface of the hole injection layer 4, in terms of binding energy. As such, the occupied energy level of the hole injection layer 4 is referred to as "the occupied energy level near the Fermi surface" in the following description.

The existence of the occupied energy level near the Fermi surface results in a so-called interface energy level alignment being formed at an interface between the hole injection layer 4 and the functional layer (the buffer layer 6A, in this case). By the interface energy level alignment being formed, the energy level of the HOMO of the buffer layer 6A substantially equals the occupied energy level near the Fermi surface of the hole injection layer 4, in terms of binding energy.

Note that the expressions "substantially equals" and "interface energy level alignment being formed" as referred to herein indicate a state where a gap between the lowest occupied energy level near the Fermi surface of the hole injection layer 4 and the lowest energy level of the HOMO of the functional layer, at an interface between the hole injection layer 4 and the functional layer, is equal to or less than 0.3 eV in terms of binding energy.

Furthermore, the expression "interface" as referred to here denotes an area which includes a surface of the hole injection layer 4 facing the buffer layer 6A, and a portion of the buffer layer 4 which is within 0.3 nm in distance from the surface of the hole injection layer 4 facing the buffer layer 6A.

In addition, for example, the occupied energy level near the Fermi surface may be present at all portions of the hole injection layer 4. However, the present disclosure is not limited to this. Other cases are included within the scope of the present invention, provided that the occupied energy level near the Fermi surface is present at least at the interface between the hole injection layer 4 and the buffer layer 6A.

(Banks)

On the surface of the hole injection layer 4, banks 5 composed of insulating material are formed. The banks 5 are disposed such that each of the banks 5 has a uniform trapezoidal cross-section, and such that the banks 5 form either a line bank structure or a pixel bank structure on the surface of the hole injection layer 4. The banks 5 are formed with organic material such as resin or inorganic material such as glass. Examples of the organic material include acrylic resin, polyimide resin, novolac-type phenolic resin, etc. Examples of the inorganic material include silicon oxide ($SiO_2$), silicon nitride ($Si_3N_4$), etc. For example, the banks 5 may have resistance against organic solvents and transmit visible light to some extent. Further, since there are cases where the banks 5 undergo etching, baking and other similar processing, for example, the banks 5 may be formed by using a material having a high degree of resistance against such processing. By the provision of the banks 5, the surface of the hole injection layer 4 is divided into a plurality of sections. At each of the sections on the surface of the hole injection layer 4, a functional layer is formed. The functional layer includes the buffer layer 6A, and a light-emitting layer 6B of a corresponding color among the colors R, G, and B. As is illustrated in FIG. 1, when applying the organic EL element 1000 to an organic EL panel, a plurality of units (pixels) of organic EL elements 1000 are disposed in parallel on the surface of the substrate 1. More specifically, each unit, or pixel, is a series of three organic EL elements 1000, and each of the three organic EL elements 1000 in a pixel is allocated to a corresponding one of the colors R, G, and B.

Here, it should be noted that the banks 5 are not indispensable in the present disclosure, and when the organic EL element 1000 is to be used alone, the banks 5 need not be formed.

(Buffer Layer)

The buffer layer 6A is a 20 nm-thick layer of TFB (poly(9, 9-di-n-octylfluorene-alt-(1,4-phenylene-((4-sec-butylphenyl)imino)-1, 4-phenylene)), which is an amine-containing organic polymer.

(Light-emitting Layer)

The light-emitting layer 6B is a 70 nm-thick layer of F8BT (poly(9,9-di-n-octylfluorene-alt-benzothiadiazole)), which is an organic polymer. However, the material to be used in forming the light-emitting layer 6B is not limited to this, and the light-emitting layer 6B may include a commonly-known organic material. Examples of such commonly-known organic material for the light-emitting layers 6B include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488. When the light-emitting layer 6B includes a layer formed with high molecular material, the light-emitting layer 6B can be formed by forming the layer of high molecular material by application of a printing technology such as an inkjet method and a nozzle coating method. The forming of the light-emitting layer 6B in such a manner readily contributes in the reduction of cost in the manufacturing of large-sized organic EL panels compared to when a vapor deposition method using low molecular material is applied.

(Functional Layer)

The functional layer of the present disclosure is either one of, a combination of more than two of, or a combination of all of layers such as a hole transfer layer, a light-emitting layer, and a buffer layer. The hole transfer layer transfers holes, the light-emitting layer emits light as a result of recombination of holes and electrons which are injected thereto, and the buffer layer is used for adjusting optical characteristics of the organic EL element 1000 and/or for blocking electrons. Although the present disclosure focuses on the hole injection layer, an organic EL element commonly includes, in addition to the hole injection layer, layers each having a corresponding function, such as the above-described hole transfer layer, light-emitting layer and the like. As such, the expression "functional layer" herein refers to all such layers which are desirably included in an organic EL element, in addition to a hole injection layer.

(Electrodes, Substrate, etc.)

The cathode 8 includes a 5 nm-thick barium layer 8A and a 100 nm-thick aluminum layer 8B, which are disposed one on top of the other.

The anode 2 and the cathode 6 are connected to a power supply indicated by DC in FIG. 1, which enables power to be supplied to the organic EL element 1000 from the outside.

The substrate 1 may be formed with one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

(Effects and Advantages of Organic EL Element)

As described in the above, the organic EL element 1000 includes the hole injection layer 4 having the occupied energy level near the Fermi surface. Thus, the hole injection barrier between the hole injection layer 4 and the buffer layer 6A is reduced. Hence, when voltage is applied to the organic El element 1000 during a drive state thereof, holes are injected relatively smoothly and at a low voltage from the occupied energy level near the Fermi surface of the hole injection layer 4 to the HOMO of the buffer layer 6A. As a result, the organic EL element 1000 exhibits excellent hole injection efficiency.

Note that a report has been made in the past of the technology of applying tungsten oxide as the material of the hole injection layer (refer to Non-Patent Literature 1). However, the hole injection layer obtained in the report had an optimum thickness of approximately 0.5 nm, and further, the voltage-electric current characteristics of the hole injection layer were greatly dependent upon film thickness of the hole injection layer. Thus, the hole injection layer of Non-Patent Literature 1 does not exhibit a level of practicality which enables application thereof to the mass production of large-sized organic EL panels. Furthermore, Non-Patent Literature 1 does not suggest forming the occupied energy level near the Fermi surface in the hole injection layer in a constructive manner. In contrast, the present disclosure is characterized in that a predetermined occupied energy level near the Fermi surface is provided to a chemically-stable hole injection layer that is composed of tungsten oxide and that withstands processing during mass production of large-sized organic EL panels. The provision of the occupied energy level near the Fermi surface realizes excellent hole injection efficiency of the hole injection layer and enables the organic EL element pertaining to the present disclosure to be driven at a low voltage. Hence, the invention as disclosed in the present disclosure largely differs from conventional technology.

In the following, description is provided of an example of an overall method for manufacturing the organic EL element 1000.

(Manufacturing Method of Organic EL Element)

Firstly, the substrate 1 is mounted inside a chamber of a sputtering film-forming device. Then, a predetermined sputtering gas is introduced into the chamber, and the 50 nm-thick anode 2 composed of ITO is formed according to a reactive sputtering method.

The forming of the hole injection layer 4 is performed subsequently. Here, for example, the hole injection layer 4 may be formed similarly according to a reactive sputtering method. Especially, in a case where the organic EL element of the present disclosure is to be applied to a large-sized organic EL panel, the hole injection layer 4 needs to be formed over a large area. In such a case, the forming of the hole injection layer 4 according to a vapor deposition method is problematic in that there is a risk that unevenness may be formed in terms of film thickness, etc. The occurrence of such unevenness can be readily prevented by forming the hole injection layer 4 according to a reactive sputtering method.

More specifically, a reactive sputtering method is performed after replacing the previous sputtering target with metal tungsten. Further, argon gas and oxygen gas are respectively introduced into the chamber as the sputtering gas and the reactive gas. Under this condition, the argon in the argon gas is ionized by the application of high voltage, and the ionized argon is caused to bombard the sputtering target. The metal tungsten ejected as a result of the sputtering phenomenon reacts with the oxygen, and produces tungsten oxide. As a result, the "sputtered" tungsten oxide forms a film on the anode 2 of the substrate 1.

Note that in the forming of the hole injection layer 4, it is desirable that the tungsten oxide film be formed under conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm$^2$ and lower than or equal to 2.8 W/cm$^2$. By forming the hole injection layer 4 under such conditions, the hole injection layer 4 having an occupied energy level which is 1.8 eV to 3.6 eV lower than the lowest energy level of a valence band of the hole injection layer 4, in terms of binding energy, is yielded.

Subsequently, as the material for forming the banks 5, photosensitive resin material or, more desirably, photoresist material containing fluorine material is prepared. In order to form the banks 5, first, the bank material so prepared is uniformly applied on the hole injection layer 4. After performing prebaking, a mask having an aperture of a predetermined shape (a pattern of the banks 5 to be formed) is placed over the prebaked bank material. After exposing the bank material to light from over the mask, unhardened, redundant bank material is removed by using a developer. Finally, by performing rinsing with pure water, the banks 5 are yielded.

Here, it should be noted that in the present embodiment, the hole injection layer 4 is composed of tungsten oxide. Tungsten oxide has resistance with respect to dissolution, decomposition, and degradation by alkaline solutions, water, organic solvents, etc. For this resistance, even when the hole injection layer 4 having been formed falls into contact with such solutions, pure water, etc. in the bank forming process, damage to the hole injection layer 4, by dissolution, decomposition, degradation and the like, is prevented. Thus, the hole injection layer 4 maintains an appropriate form thereof upon completion of the manufacturing of the organic EL element 1000. This too, in addition to the above-described characteristics of the present disclosure, enables the efficient injection of holes to the buffer layer 6A via the hole injection layer 4, and further enables the organic EL element 1000 to be driven in excellent state at a low voltage.

Following this, the buffer layer 6A is formed by depositing drops of ink composition containing organic amine-containing molecular material onto a surface of the hole injection layer 4, which is exposed from between adjacent ones of banks 5, and removing the solvent of the ink composition by volatilization. The depositing of ink composition is performed according to a wet process, such as an inkjet method and a gravure printing method.

Following the forming of the buffer layer 6A, drops of ink composition containing organic light-emitting material is deposited onto the surface of the buffer layer 6A, and again, the solvent of the ink composition is removed by volatilization by applying a similar method as in the forming of the buffer layer 6A. Thus, the light-emitting layer 6B is formed.

Here, it should be noted that the method applied for forming the buffer layer 6A and the light-emitting layer 6B is not limited to the above-described method. Other commonly-known methods besides an inkjet method and a gravure printing method may be applied for depositing and applying ink. Such commonly-known methods include: a dispenser method; a nozzle coating method; a spin coating method; intaglio printing; relief printing and the like.

Subsequently, the barium layer 8A and the aluminum layer 8B are formed on a surface of the light-emitting layer 6B by applying a vacuum vapor deposition method. Thus, the cathode 8 is formed.

It should be noted that, although not illustrated in FIG. 1, a sealing layer may be additionally provided on the surface of the cathode 8, or a sealing cap may be provided to isolate the entire organic EL element 1000 from external space, in order as to prevent atmospheric exposure of the organic EL element 1000. The sealing layer may be formed, for example, by using materials such as SiN (silicon nitride) and SiON (silicon oxynitride), and may be disposed such that the organic EL element 1000 is sealed therein. When using a sealing cap to prevent atmospheric exposure of the organic EL element 1000, the sealing cap may be formed by using, for example, the same material as the substrate 1, and a getter which absorbs moisture and the like may be provided within the sealed space formed by the substrate 1 and the sealing cap.

By following the above-provided procedures, the manufacturing of the organic EL element 1000 is completed.

<Experiments and Observations>

(Conditions for Forming the Tungsten Oxide Layer)

In the embodiment of the present disclosure, the hole injection layer 4 is yielded by forming a film of tungsten oxide under predetermined conditions. The forming of the tungsten oxide film under such film forming conditions provides the hole injection layer 4 with the occupied energy level near the Fermi surface, which results in the hole injection barrier between the injection layer 4 and the buffer layer 6A being reduced. Furthermore, the organic EL element 1000 having a hole injection layer formed under such film forming conditions can be driven at a low voltage.

In order as to obtain a tungsten oxide film having the above-described characteristics, a DC magnetron sputtering device is used in the forming thereof. The sputtering target is metal tungsten, and the processing is performed while not controlling substrate temperature, and by introducing argon gas and oxygen gas into the chamber of the sputtering device. In such an environment, the tungsten oxide film is formed by applying a reactive sputtering method under film forming conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm$^2$ and lower than or equal to 2.8 W/cm$^2$.

The effectiveness of such film forming conditions (i) through (iii) have been proved through the following experiments.

Firstly, the inventors prepared hole-only devices as assessment devices to be used in accurately determining the dependence of hole injection efficiency on the conditions under which the tungsten oxide film is formed. Needless to say, here the expression "hole injection efficiency" refers to the efficiency with which holes are injected into the buffer layer 6A from the hole injection layer 4.

Basically, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 2:
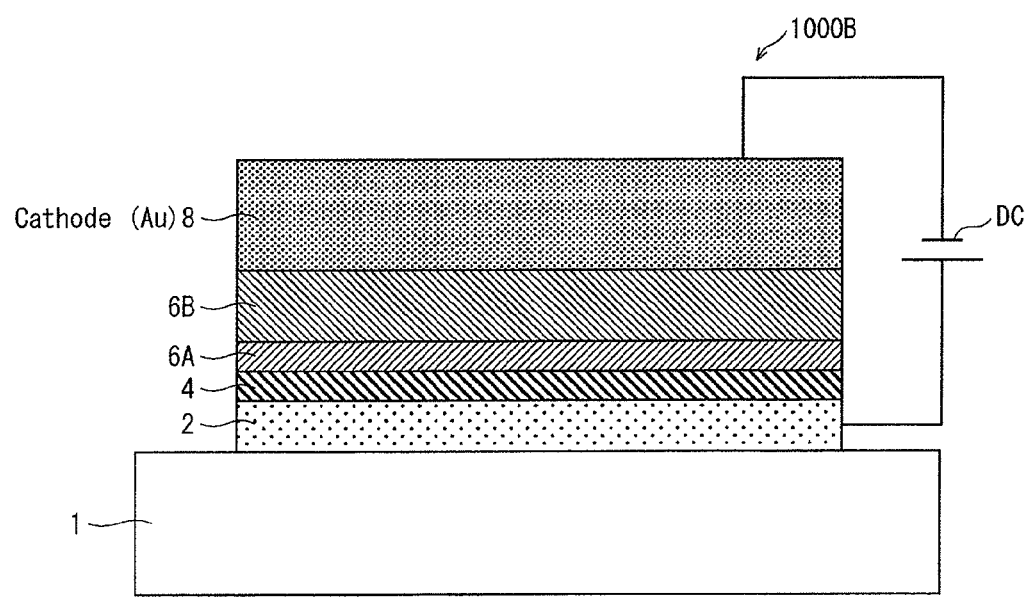
FIG. 2 is a schematic cross-sectional view illustrating a structure of a hole-only device.

In detail, the hole-only devices prepared by the inventors were actually obtained by replacing the cathode 8 of the organic EL element 1 illustrated in FIG. 1000 with gold (Au) to form a cathode 9 as illustrated in FIG. 2. More specifically, as illustrated in FIG. 2, the inventors prepared the hole-only devices by forming the 50 nm-thick anode 2 composed of an ITO thin film on the substrate 1, and further disposing, on the anode 2 so formed, the following layers in the order in which they are introduced: a 30 nm-thick hole injection layer 4 composed of tungsten oxide; a 20 nm-thick buffer layer 6A composed of TFB, which is an organic amine-containing polymer; a 70 nm-thick light-emitting layer 6B composed of F8BT, which is an organic polymer; and a 100 nm-thick cathode 9 composed of gold. Note that, considering that the hole-only devices are assessment devices, the banks 5 were omitted from the structure thereof.

In the manufacturing of the hole-only devices, the hole injection layers 4 of the hole-only devices were similarly formed by applying a reactive sputtering method in a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Further, in order as to obtain the hole-only devices, changes were made to certain film forming conditions, namely total gas pressure, oxygen partial pressure, and input power, as illustrated in Table 1. As a result, hole-only devices 1000B (devices No. 1 through No. 14), each having a hole injection layer 4 formed under different film forming conditions, were obtained. Note that, hereinafter, oxygen partial pressure is indicated as a ratio (%) with respect to the total pressure of the gases in the chamber of the sputtering device.

rent density) for each of the hole-only devices 1000B. More specifically, the voltage applied to the hole-only devices was changed, and a value indicating electric current flowing was obtained at different voltages. Further, conversion was performed on the electric current values to obtain an electric current density value of the hole-only devices 1000B. Note that hereinafter, the expression "driving voltage" refers to different voltages applied to the hole-only devices 1000B when the current density value is 10 mA/cm$^2$.

In short, it could be said that the smaller the driving voltage, the higher the hole injection efficiency of the hole injection layer 4 is. This is since, the members composing the hole-only devices 1000B, other than the hole injection layer 4, are prepared according to the same manufacturing method, and thus, it could be assumed that the hole injection barrier between two adjacent layers, other than the hole injection layer 4, is uniform in each of the hole-only devices 1000B. In addition, it has been confirmed through another experiment that the cathode 2 and the hole injection layer 4 in each of the hole-only devices 1000B used in this experiment are in ohmic contact. Considering the above, it could be expected that the differences in driving voltage of the hole-only devices 1000B,

TABLE 1

Film Forming Conditions of the Hole-only Devices 1000B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

TABLE 2

| Input Power (W) | Input Power Density (W/cm$^2$) |
|---|---|
| 250 | 1.4 |
| 500 | 2.8 |
| 1000 | 5.6 |

Following the completion of the preparation of the hole-only devices 1000B, the inventors connected each of the hole-only devices 1000B to the direct current power supply DC, and applied voltage thereto. Further, the inventors obtained an electric current value per unit surface area (curwhich results from the different film forming conditions according to which the hole injection layer 4 is formed, strongly reflects the hole injection efficiency from the hole injection layer 4 to the buffer layer 6A in each of the hole-only devices 1000B.

Table 3 illustrates each of the hole-only devices 1000B and a driving voltage thereof. Further, the hole only devices 1000B are classified in Table 3 according to the film forming conditions under which the hole injection layer 4 of each of the hole-only devices 1000B was formed. More specifically, classification is made according to the film forming conditions of: total pressure; oxygen partial pressure; and input power. Note that the numbers enclosed in circles in Table 3 indicate the device number of each of the hole-only devices 1000B.

TABLE 3

Film Forming Conditions and Driving Voltages of the Hole-only Devices 1000B
(Applied Voltage Value under Electric Current Density of 10 mA/cm²)

| | | Total Pressure | | |
|---|---|---|---|---|
| | | 1.7 Pa | 2.7 Pa | 4.8 Pa |
| Oxygen Partial Pressure | 30% | ⑫ 500 W (Unmeasured) | ⑬ 500 W (19 V) | Film could not be formed |
| | 50% | ④ 500 W (19 V) | ⑩ 500 W (19 V) | ⑭ 250 W (13.7 V)<br>② 500 W (13.7 V)<br>⑧ 1000 W (>20 V) |
| | 70% | ⑪ 500 W (Unmeasured) | ⑤ 250 W (14.7 V)<br>① 500 W (18.2 V)<br>⑦ 1000 W (>20 V) | Film could not be formed |
| | 100% | ⑥ 250 W (Unmeasured)<br>③ 500 W (>20 V)<br>⑨ 1000 W (>20 V) | Film could not be formed | Film could not be formed |

*Numbers enclosed in circles indicate device No., numbers without parenthesis indicate input electricity, and numbers placed in parenthesis indicate driving voltage.

Figure 3A:
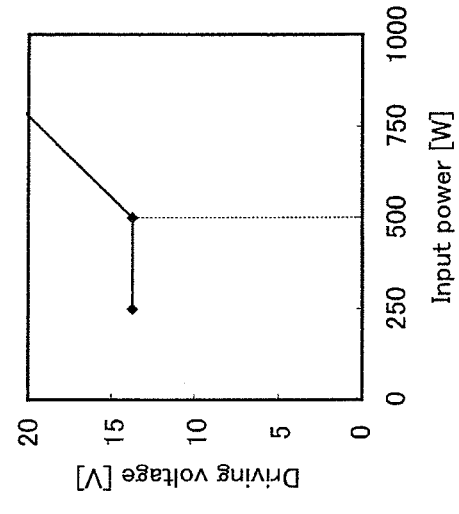
FIGS. 3A through 3C are graphs illustrating a dependence of driving voltage of hole-only devices on film forming conditions of a hole injection layer.
Figure 3B:
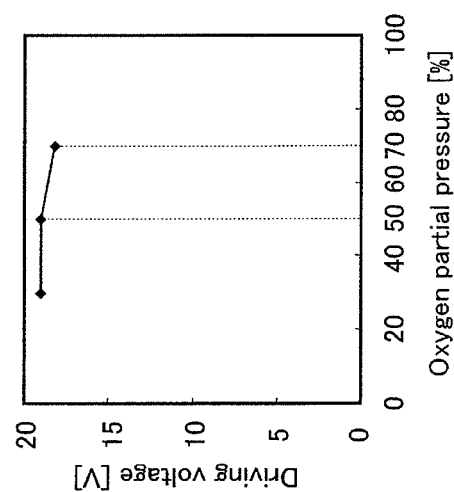
Figure 3C:
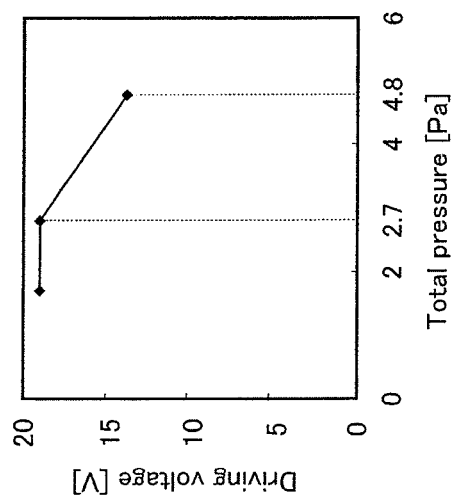

Further, FIGS. 3A through 3C are graphs illustrating the dependence of driving voltages of the hole-only devices 1000B on the film forming conditions. The points in FIG. 3A indicate, from left to right, driving voltages of the devices No. 4, No. 10, and No. 2. The points in FIG. 3B indicate, from left to right, driving voltages of the devices No. 13, No. 10, and No. 1. The points in FIG. 3C indicate, from left to right, driving voltages of the devices No. 14, No. 2, and No. 8.

Here, it should be noted that under the following conditions (i) through (iv), the forming of the hole injection layer 4 was not successfully performed due to limitations of the sputtering device, such as gas flow amount. In specific, the hole injection layer 4 was not formed when: (i) total pressure was 2.7 Pa and oxygen partial pressure ratio was 100%; (ii) total pressure was 4.8 Pa and oxygen partial pressure ratio was 30%; (iii) total pressure was 4.8 Pa and oxygen partial pressure ratio was 70%; and (iv) total pressure was 4.8 Pa and oxygen partial pressure ratio was 100%.

Firstly, concerning the dependence of driving voltage on total pressure, when the oxygen partial pressure ratio was set to 50% and the input power was set to 500 W, a clear reduction in driving voltage was observed when the total pressure was set higher than 2.7 Pa and lower than or equal to 4.8 Pa, as illustrated in FIG. 3A. In addition, as a result of a different experiment, it was found that this trend of reduction in driving voltage continues at least until the total pressure is lower than or equal to 7.0 Pa. Taking this into account, total pressure during the forming of the hole injection layer 4 may be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 3B. However, as a result of a different experiment, it was found that when the oxygen partial pressure ratio exceeds this range, the driving voltage begins to increase adversely. Taking this into account, for example, oxygen partial pressure ratio during the forming of the hole injection layer 4 may be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 3C. Taking this into account, for example, input power may be restricted to be lower than or equal to 500 W. Here, it should be noted that, when referring to devices No. 1 and No. 3 in Table 3, it could be seen that, even when the input power was set to 500 W, driving voltage increased when the total pressure was set lower than or equal to 2.7 Pa.

Figure 4:
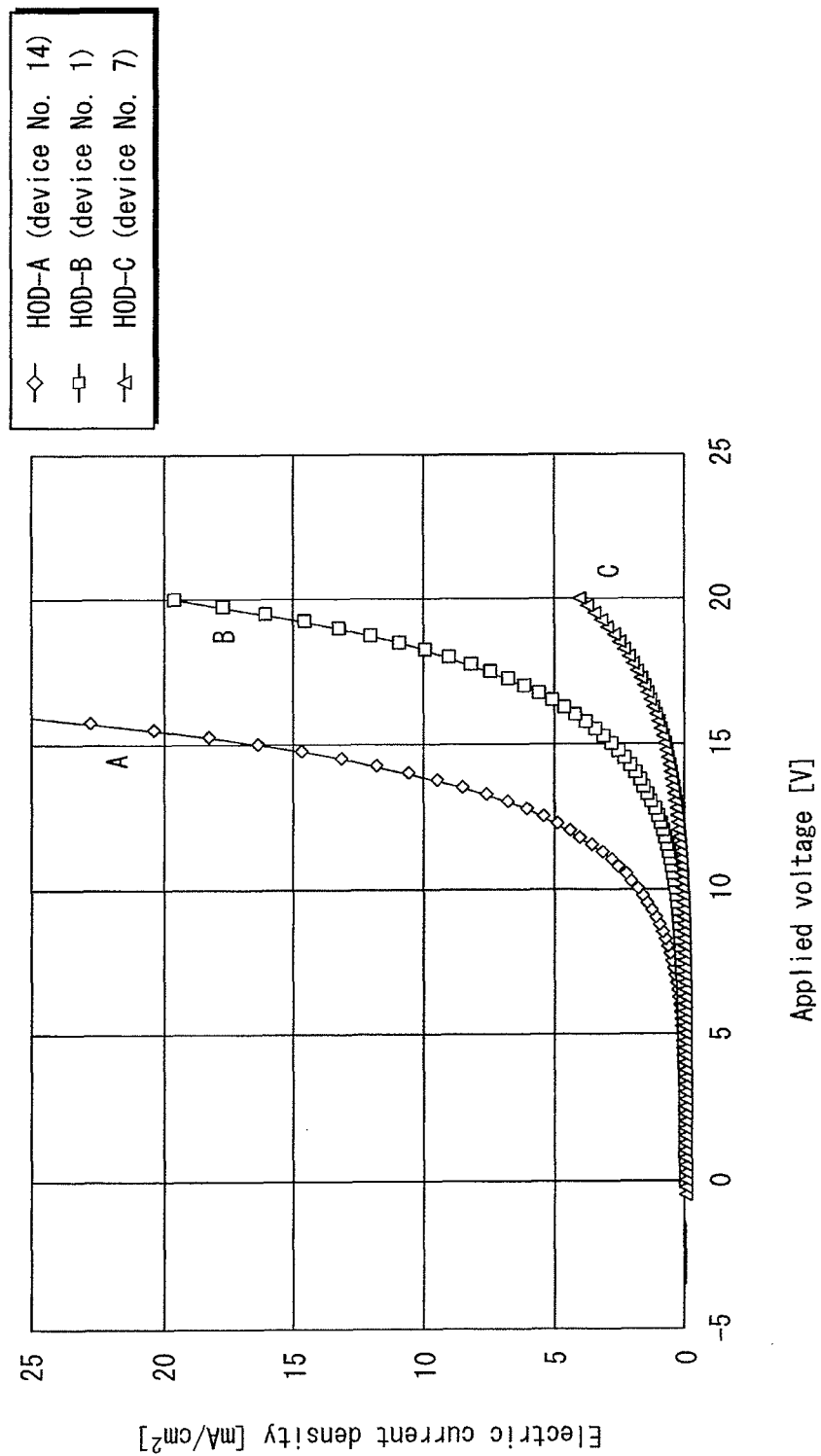
FIG. 4 is a device characteristics diagram illustrating a relation curve illustrating a relation between applied voltage and electric current density of the hole-only devices.

The subsequent FIG. 4 illustrates an electric current density-applied voltage curve of the hole-only devices 1000B, taking devices No. 14, No. 1, and No. 7 as examples. In FIG. 4, the vertical axis indicates electric current density (mA/cm²), whereas the horizontal axis indicates applied voltage (V). Furthermore, device No. 14 fulfills all desirable film forming conditions explained in the above of total pressure, oxygen partial pressure, and input power, while on the other hand, each of devices No. 1 and No. 7 does not fulfill at least one of the desirable film forming conditions.

Concerning the film forming conditions under which the hole injection layer 4 (and the later-described tungsten oxide layer 80) is formed, in order as to facilitate the explanations to be provided in the following, hereinafter, the film forming conditions under which the hole injection layer 4 was formed in device No. 14 is referred to as film forming conditions A, the film forming conditions under which the hole injection layer 4 was formed in device No. 1 is referred to as film forming conditions B, and the film forming conditions under which the hole injection layer 4 was formed in device No. 7 is referred to as film forming conditions C. In addition, devices No. 14, No. 1, and No. 7 are respectively illustrated as HOD-A, HOD-B, and HOD-C in FIG. 4 and Table 3.

As illustrated in FIG. 4, the electric current density-applied voltage curve indicating HOD-A indicates that HOD-A has a higher degree of responsiveness to an increase in applied voltage compared with HOD-B and HOD-C. Further, it could be seen that HOD-A requires the lowest level of applied voltage to reach a high electric current density compared with HOD-B and HOD-C. From this, it is obvious that HOD-A has a higher degree of hole injection efficiency compared with HOD-B and HOD-C. Here, it should be noted that HOD-A operates at the lowest driving voltage among the hole-only devices 1000B.

In the above, observation has been made of the hole injection efficiency of the hole injection layer 4 in each of the hole-only devices 1000B. However, here it should be emphasized that the hole-only devices 1000B and the organic EL element 1000 illustrated in FIG. 1 have substantially the same structure, differing only in the cathodes included. Therefore, the dependence of the hole injection efficiency from the hole injection layer 4 to the buffer layer 6A on the film forming conditions under which the hole injection layer 4 is formed in the organic EL element 1000 is basically the same as in the hole-only devices 1000B. In order as to confirm such similarity in the dependence on the film forming conditions under which the hole injection layer 4 is formed, the inventors prepared three separate organic EL elements 1000, each having a hole injection layer 4 formed under a corresponding one of film forming conditions A, film forming conditions B, and film forming conditions C.

More specifically, the inventors prepared the organic EL elements 1000 illustrated in FIG. 1 by forming a 50 nm-thick anode 2 composed of an ITO thin film on the substrate 1, and further disposing, on the anode 2 so formed, the following layers in the order in which they are introduced: a 30 nm-thick hole injection layer 4 composed of tungsten oxide; a 20 nm-thick buffer layer 6A composed of TFB, which is an organic amine-containing polymer; a 70 nm-thick light-emitting layer 6B composed of F8BT, which is an organic polymer; and a cathode 8 composed of a 5 nm-thick barium layer and a 100 nm-thick aluminum layer. Note that, considering that the hole-only devices are assessment devices, the banks 5 were omitted from the structure thereof.

Figure 5:
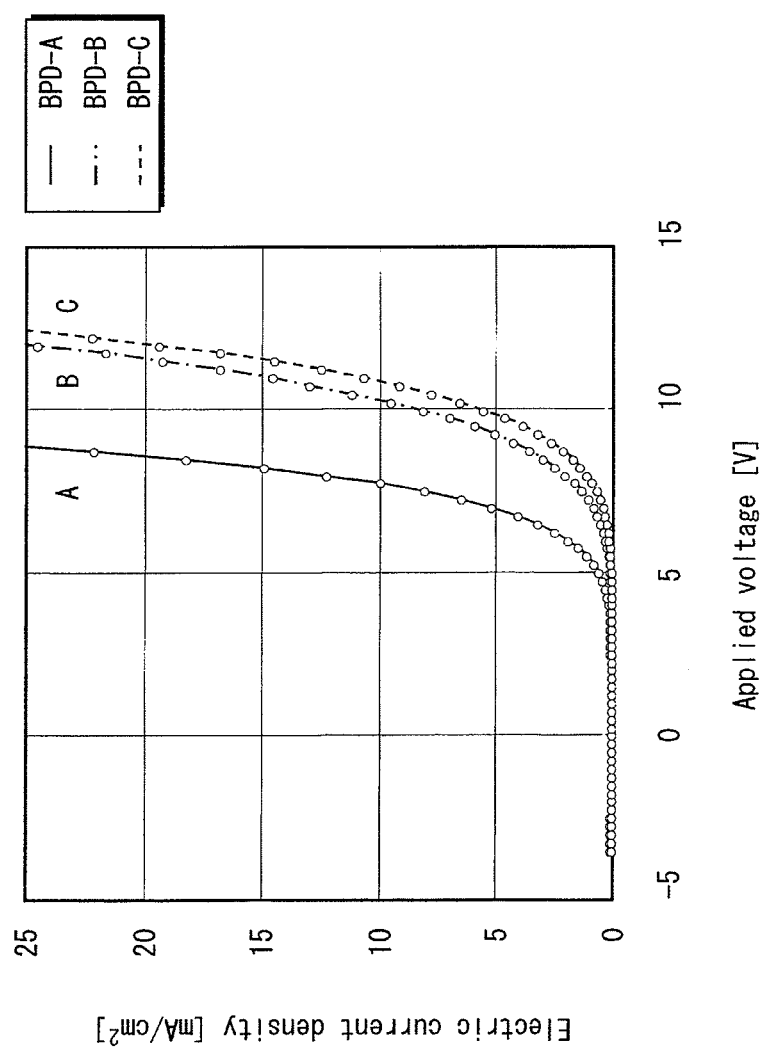
FIG. 5 is a device characteristics diagram illustrating a relation curve illustrating a relation between applied voltage and electric current density of an organic EL element prepared by the inventors.

The inventors connected the organic EL devices 1000 prepared under the corresponding one of the film forming conditions A, B, and C to the direct current power supply DC, and applied voltage thereto. FIG. 5 illustrates an electric current density-applied voltage curve indicating the relation between the electric current density value and the applied voltage. More specifically, the inventors obtained an electric current value per unit surface area (electric current density) for each of the organic EL elements 1000 by changing the voltage applied to the organic EL elements 1000, obtaining a value indicating electric current flowing at different voltages, and converting the electric current value into the electric current density value. In FIG. 5, the vertical axis indicates electric current density (mA/cm$^2$), whereas the horizontal axis indicates applied voltage (V).

Note that, in order as to facilitate the explanations to be made in the following, the organic E1 elements 1000 prepared under film forming conditions A, B, and C are respectively illustrated as BPD-A, BPD-B, and BPD-C in FIG. 5.

As illustrated in FIG. 5, the electric current density-applied voltage curve indicating BPD-A indicates that HOD-A has a higher degree of responsiveness to an increase in applied voltage compared with BPD-B and BPD-C. Further, it could be seen that BPD-A requires for the lowest level of applied voltage to reach a high electric current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 6:
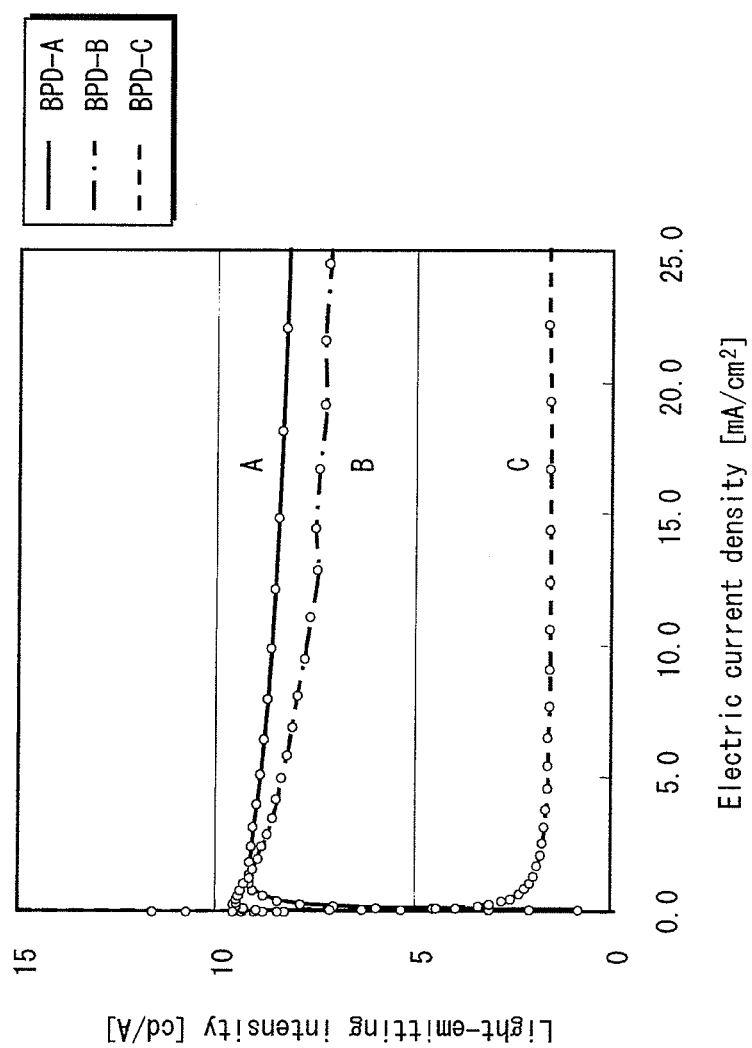
FIG. 6 is a device characteristics diagram illustrating a relation curve illustrating a relation between electric current density and light-emitting intensity of the organic EL element prepared by the inventors.

In addition, FIG. 6 illustrates light-emitting intensity-electric current density curves corresponding to the organic EL elements 1000 prepared in the above. Each light-emitting intensity-electric current density curve indicates the relation between the change in electric current density and the resultant change in light-emitting intensity of the corresponding organic EL element 1000. In FIG. 6, the vertical axis indicates light-emitting intensity (cd/A), whereas the horizontal axis indicates electric current density (mA/cm$^2$). According to FIG. 6, it can be seen that BPD-A has the highest light-emitting intensity among the three organic EL elements 1000, at least within the range of electric current density that was measured in the experiment.

From the above results, it was confirmed that, concerning the organic EL elements 1000, the hole injection efficiency of the hole injection layer 4 depends on the film forming conditions, similar as in the case of the hole-only devices 1000B. That is, when forming the tungsten oxide film composing the hole injection layer 4 by using metal tungsten as the sputtering target in a DC magnetron sputtering device by applying a reactive sputtering method while no control is performed with respect to substrate temperature and the chamber gas used is composed of argon gas and oxygen gas, a hole injection layer 4 having the highest hole injection efficiency with respect to the buffer layer 6A was produced under film forming conditions where: (i) total pressure is higher than 2.7 Pa and lower than or equal to 7.0 Pa; (ii) oxygen partial pressure ratio is higher than or equal to 50% and lower than or equal to 70%; and (iii) input power density is higher than or equal to 1 W/cm$^2$ and lower than or equal to 2.8 W/cm$^2$. Thus, it was confirmed that a hole injection layer 4 formed while fulfilling the exemplary film forming conditions (i), (ii), and (iii) realizes both low voltage drive and high light-emitting efficiency.

Note that in the above, the film forming condition (iii) concerning input power is indicated in terms of input power density by referring to Table 2. In addition, when using a DC magnetron sputtering device that is different from the DC magnetron sputtering device used in the present experiment, a hole injection layer 4 composed of tungsten oxide having a high hole injection efficiency can be similarly yielded by adjusting input power according to the size of the sputtering target. The adjustment of input power should be performed such that the input power density fulfills condition (iii) above. Concerning the other conditions (i) and (ii), total pressure and oxygen partial pressure should each be set within the above-provided range, regardless of the device to be used and the size of the sputtering target.

Additionally, as already explained in the above, no intentional adjustment of the substrate temperature was performed while forming the hole injection layer 4 by applying a reactive sputtering method. And during the experiment, the sputtering device was placed under room temperature. Therefore, the substrate 1 was at room temperature at least before the forming of the hole injection layer 4 was performed. However, while forming of the hole injection layer 4 is being performed, there is a possibility that the substrate temperature may rise by several tens of degrees Celsius.

Furthermore, the organic EL element 1000 having the hole injection layer 4 formed under film forming conditions A corresponds to the organic EL element 1000 in the present embodiment, which has the occupied energy level near the Fermi surface. Detailed observation is to be made regarding this point in the following.

(Electronic State of the Hole Injection Layer)

The tungsten oxide composing the hole injection layer 4 of the organic EL element 1000 pertaining to the present embodiment has the occupied energy level near the Fermi surface. The occupied energy level near the Fermi surface is formed by adjusting the film forming conditions under which the hole injection layer 4 is formed as description has been provided in the above. Details concerning this point are provided in the following.

The inventors conducted an experiment to determine whether the occupied energy level near the Fermi surface exists in each of the tungsten oxide films formed under a corresponding one of film forming conditions A, B, and C.

Figure 7:
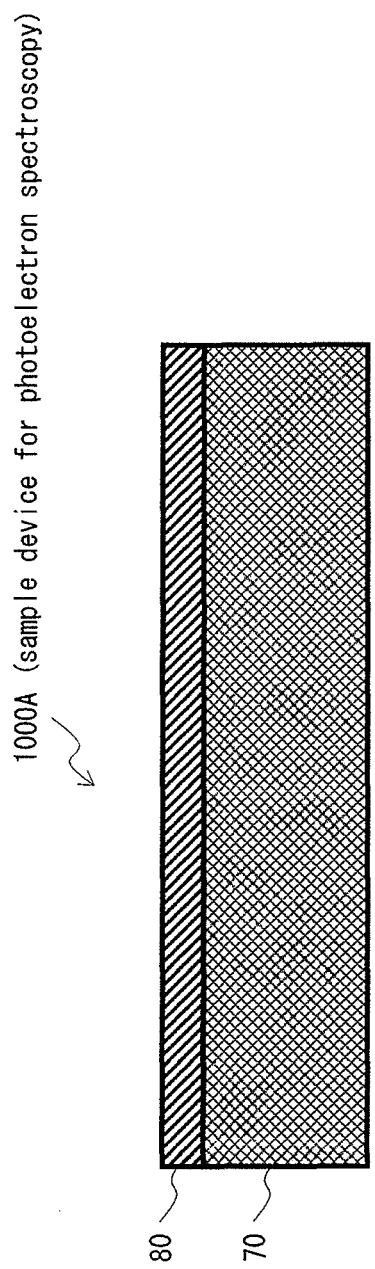
FIG. 7 is a schematic cross-sectional view illustrating a structure of a sample device which is used for photoelectron spectroscopy measurement.

The inventors prepared sample devices to be subjected to photoelectron spectroscopy measurement. Each of the sample devices was prepared under a corresponding one of the film forming conditions A, B, and C. In detail, each of the sample devices was prepared by forming a 10 nm-thick tungsten oxide layer 80 (corresponding to the hole injection layer 4) on a conductive silicon substrate 70 by applying a reactive sputtering method as described in the above. 1A in FIG. 7 indicates a sample device having such a structure. So as to facilitate explanation provided in the following, a sample device 1A formed under film forming conditions A is hereinafter referred to as sample device A, a sample device 1A formed under film forming conditions B is hereinafter referred to as sample device B, and a sample device 1A formed under film forming conditions C is hereinafter referred to as sample device C.

The forming of the tungsten oxide layer 80 of each of the sample devices was performed inside a sputtering device. Then, to prevent atmospheric exposure, the sample devices A, B, and C were transported to a glovebox filled with nitrogen gas, which was connected to the sputtering device. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 80 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 80 by utilizing UPS measurement.

The conditions under which the UPS measurement was conducted are as follows. Here, it should be noted that, since the sample devices A, B, and C commonly include the conductive silicon substrate 70, charge-up did not occur during the UPS measurement. Further, the interval between measurement points was set to 0.05 eV.

Figure 8:
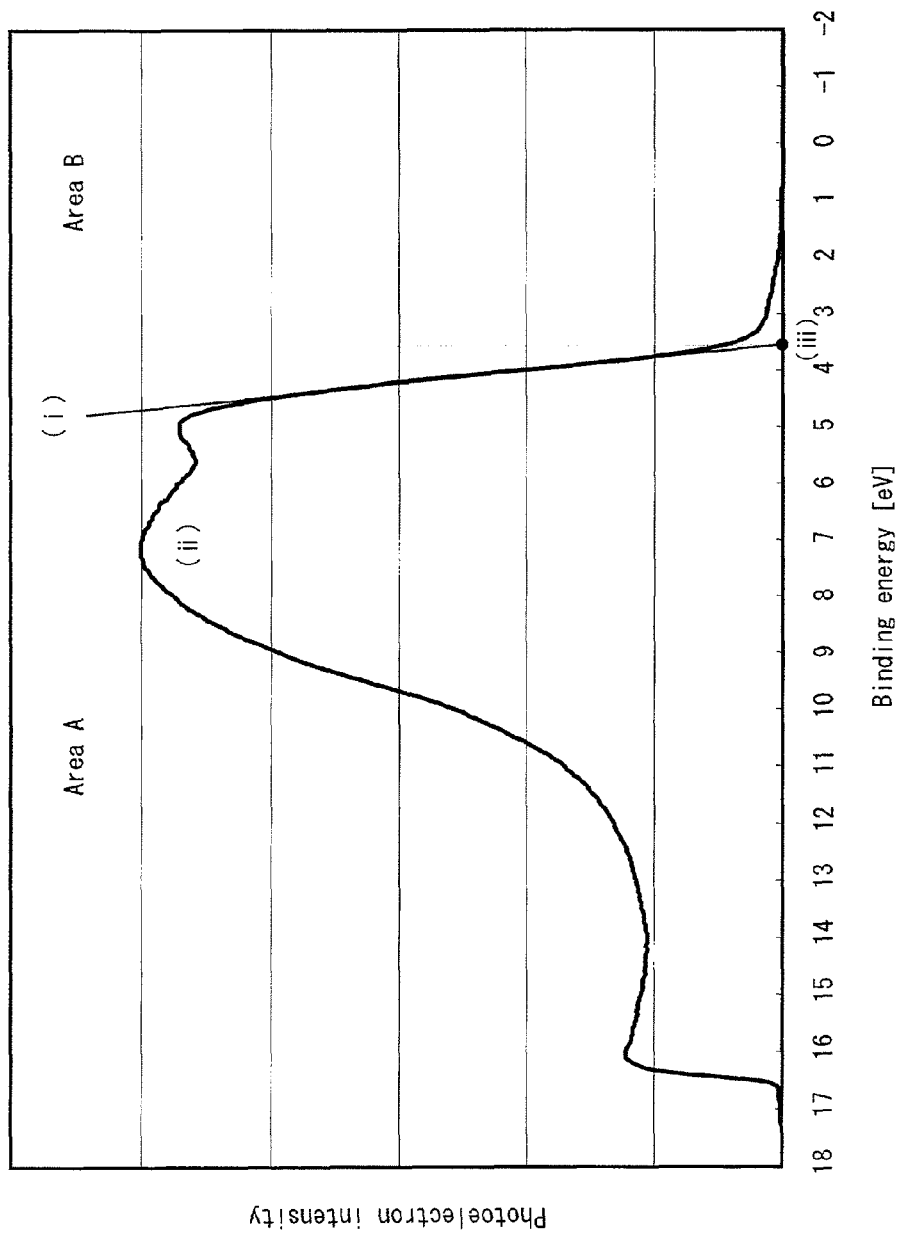
FIG. 8 illustrates a UPS spectrum of tungsten oxide.

Light source: He I line
Bias: None
Electron emission angle: Normal line direction of the substrate surface FIG. 8 illustrates a UPS spectrum of the tungsten oxide layer 80 of the sample device A. In FIG. 8, the horizontal axis indicates binding energy. The reference point on the horizontal axis corresponds to the Fermi surface of the substrate 70, and the left direction with respect to the reference point is positive, and the right direction with respect to the reference point is negative.

In the following, description is provided on each of the occupied energy levels of the tungsten oxide layer 80 with reference to FIG. 8.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area A that extends in the high binding energy direction departing from point (iii); and area B that extends in the low binding energy direction (that is, to the direction of the Fermi surface) departing from point (iii).

Here, according to Table 4, each of the sample devices A, B, and C has a tungsten oxide layer 80 whose composition ratio between tungsten atoms and oxygen atoms is approximately 1:3. The composition ratios illustrated in Table 4 were obtained by performing X-ray photoelectron spectroscopy (XPS) measurement with respect to each of the sample devices A, B, and C. More specifically, XPS measurement of the sample devices was performed by using the photoelectron spectroscopy device while preventing atmospheric exposure of the tungsten oxide layer 80 having been formed on the sample devices, in a similar way as in the conduction of the UPS measurement. By conducting the XPS measurement, the composition ratio between tungsten and oxygen within several nanometers in distance from the surface of the tungsten oxide layer 80 was estimated for each of the sample devices A, B, and C. Note that the film forming conditions under which the tungsten oxide layer 80 in each of the corresponding sample devices were formed are also illustrated in Table 4.

TABLE 4

|  | Sample Device | | |
|---|---|---|---|
|  | Sample Device A | Sample Device B | Sample Device C |
| Film Forming Conditions | Film Forming Conditions A | Film Forming Conditions B | Film Forming Conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (Oxygen/Tungsten) | 3.0 | 2.9 | 2.8 |

According to the composition ratios obtained as a result of the XPS measurement, it could be assumed that in each of the sample devices A, B, and C, the tungsten oxide layer 80, at least within several nanometers in distance from the surface thereof, has a basic atomic arrangement which is in accordance with the atomic arrangement of tungsten trioxide. That is, the basic structure of the tungsten oxide layer 80, at least within several nanometers in distance from the surface thereof, is assumed as being a structure where oxygen atoms are bound to a tungsten atom to form an octahedral coordination, and these octahedrons share oxygen atoms at corners thereof with adjacent octahedrons. Taking this into account, the area A in FIG. 8 indicates an occupied energy level deriving from the basic structure of the tungsten oxide layer 80 as mentioned in the above, which is the structure of the crystalline phase of tungsten trioxide or of a non-crystalline phase of tungsten trioxide, which lacks the order characteristic of the crystalline phase (note that the bond between atoms is maintained in the non-crystalline phase, and therefore the above-mentioned basic structure is preserved). Thus, the area A in FIG. 8 corresponds to a so-called valence band of the tungsten oxide layer 80. Note that the inventors have performed X-ray absorption fine structure (XAFS) measurement with respect to the tungsten oxide layer 80 of each of the sample devices A, B, and C, and have confirmed that the above-mentioned basic structure is formed therein.

Accordingly, the area B in FIG. 8 corresponds to the band gap between the valence band and the conductive band of the tungsten oxide layer 8. Further, it is commonly known that an occupied energy level that differs from the occupied energy level of the valence band may exist in the area B of the tungsten oxide, as is suggested by the UPS spectrum in FIG. 8. The occupied energy level in area B derives from another structure that is different from the above-mentioned basic structure, and is referred to as a so-called band gap (in-gap state or gap state) energy level.

Figure 9:
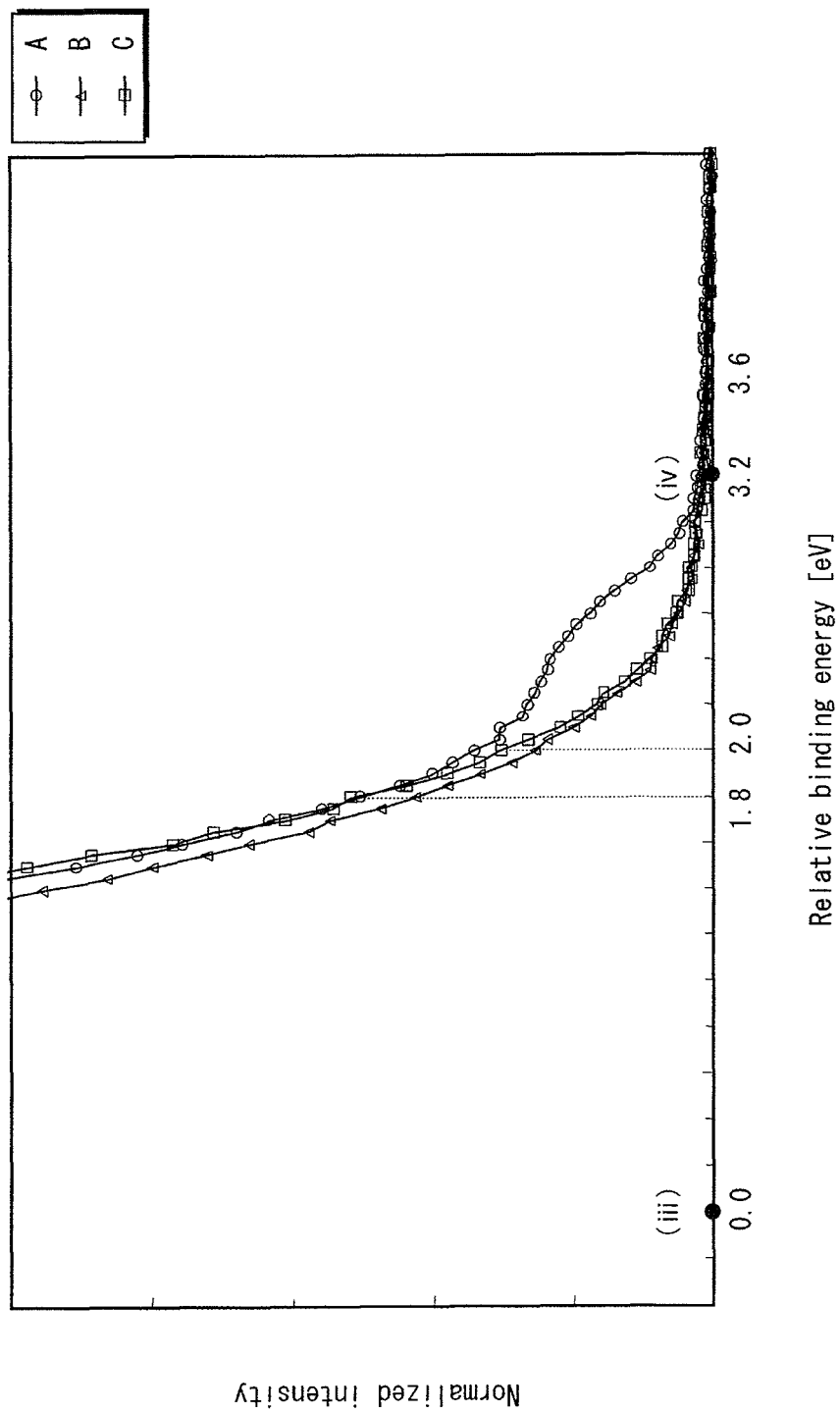
FIG. 9 illustrates UPS spectra of tungsten oxide.

The subsequent FIG. 9 illustrates a UPS spectrum of the tungsten oxide layer 80 of each of the sample devices A, B, and C, particularly within area B in FIG. 8. The spectrum intensity indicated by the vertical axis in FIG. 9 has been normalized using the peak-top intensity value of a peak (ii) in FIG. 8, which is located approximately 3 eV to 4 eV to the high binding energy direction from point (iii). In addition, note that point (iii) in FIG. 9 is illustrated at the same point on the horizontal axis as in FIG. 8. In FIG. 9, the horizontal axis indicates a relative value (relative binding energy) with respect to point (iii), and the binding energy decreases as the relative binding energy increases. That is, a point that is further to the right of point (iii) (or closer to the side of the Fermi surface) has a lower binding energy compared to a point which is closer to point (iii).

As illustrated in FIG. 9, the spectrum indicating the tungsten oxide layer 80 of the sample device A exhibits a peak in an area between a point which is 3.6 eV lower in terms of binding energy than point (iii) and a point which is 1.8 eV lower in terms of binding energy than point (iii). Point (iv) in FIG. 9 indicates a point at which such a peak in the spectrum indicating the tungsten oxide layer 80 of the sample device A is first obviously observed. That is, point (iv) is a point at which the peak begins. The existence of such a peak is not observed in the spectra corresponding to sample devices B and C.

In the present disclosure, for forming the hole injection layer 4, tungsten oxide whose UPS spectrum indicates an upward protrusion (not necessarily a peak) in an area which is 1.8 eV to 3.6 eV lower in terms of binding energy than point (iii), as illustrated in FIG. 9, is used. Hence, the organic EL element pertaining to the present disclosure exhibits excellent hole injection efficiency.

Furthermore, it has been found that hole injection efficiency is enhanced to a greater extent when the upward protrusion exhibited in the UPS spectrum of the tungsten oxide layer 80 has a higher degree of sharpness. Therefore, it can be said that the area of the UPS spectrum illustrated in FIG. 9 which is between a point 2.0 eV lower than point (iii) and another point 3.2 eV lower than point (iii), in terms of binding energy, is particularly essential, since the upward protrusion is more prominent and has a sharper inclination compared to other areas of the UPS spectrum.

Note that, in the following description, the upward protrusion as observed in the UPS spectrum of the tungsten oxide layer 80 is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the inventors performed differentiation on the normalized intensity of the UPS spectrum of each of the sample devices A, B, and C illustrated in FIG. 9. The differentiation was performed for the purpose of making the spectral protrusion near the Fermi surface more distinguishable.

In specific, by using the graph analysis software IGOR Pro 6.0, binomial smoothing (where smoothing factor was set to 1) was conducted eleven times with respect to the UPS spectra illustrated in FIG. 9, and differentiation was subsequently performed applying a central difference method. Such processing of data was conducted so as to remove fluctuation factors such as background noise generated during the UPS measurement, to smoothen the differential curves, and to convey the arguments presented in the following in as clear a manner as possible.

Figure 10:
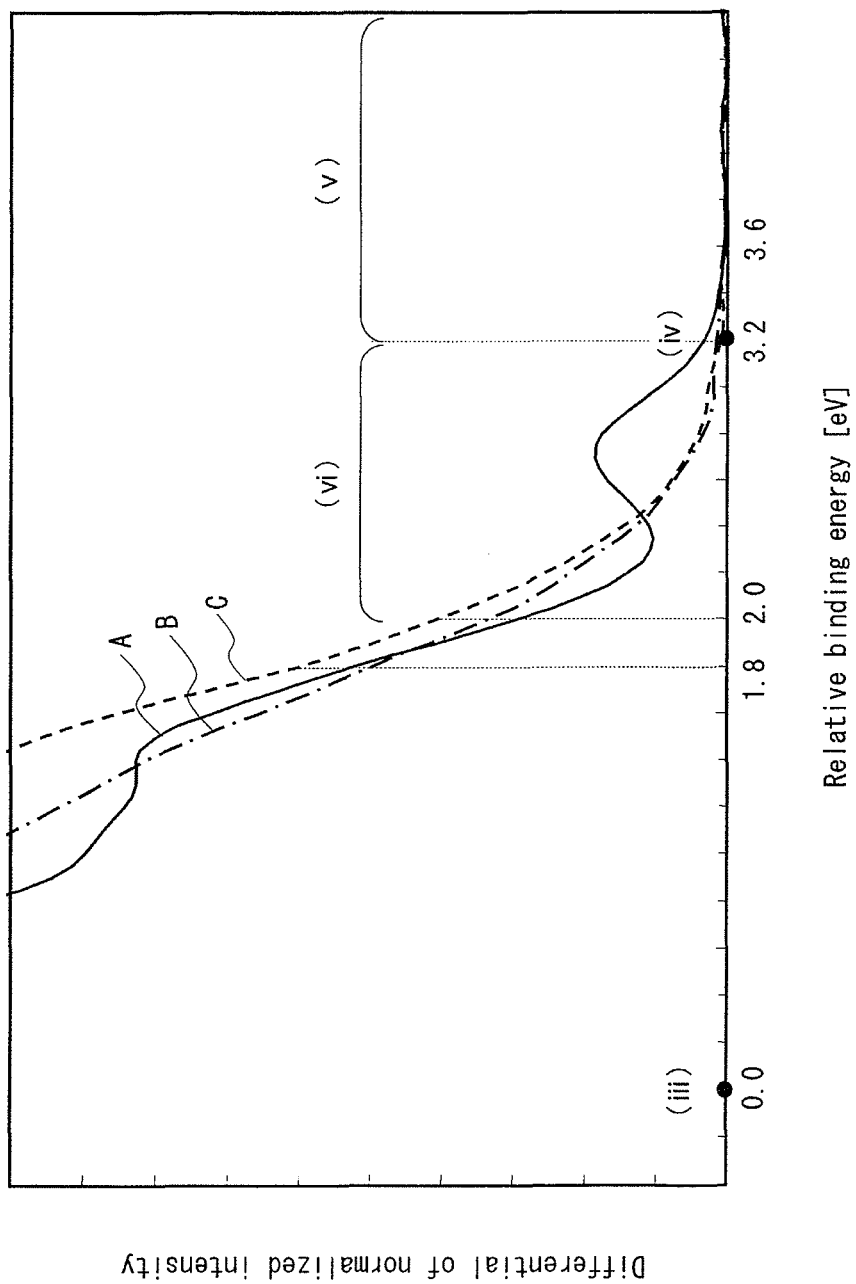
FIG. 10 illustrates differential curves corresponding to the respective UPS spectra illustrated in FIG. 9.

FIG. 10 illustrates differential curves yielded as a result of the above processing. Points (iii) and (iv) in FIG. 10 are provided at the same points on the horizontal axis as the respective points (iii) and (iv) in FIG. 9.

According to the differential curves illustrated in FIG. 10, the derivatives of normalized intensities of the tungsten oxide layers 80 corresponding to sample devices B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to sample devices B and C exhibit only a slight increase as approaching the high binding energy direction, although increase is seen in the increase rates thereof. In addition, the shapes of the differential curves corresponding to sample devices B and C within areas (v) and (vi) turn out to exhibit similarity with the respective UPS spectra illustrated in FIG. 9, from which the differential curves of FIG. 10 have been derived. Therefore, it can be said that the shapes of the UPS spectrum and the differential curve derived therefrom of each of sample devices B and C within areas (v) and (vi) resemble the shape of an exponential function curve.

Contrariwise, the differential curve corresponding to the tungsten oxide layer 80 of the sample device A in FIG. 10 exhibits a rapid rise from the vicinity of point (iv) towards the direction of point (iii). Thus, the shape of the differential curve corresponding to the tungsten oxide layer 80 of the sample device A within the areas (v) and (vi) clearly differs from the shape of an exponential function curve. Similarly, in FIG. 9, the spectrum corresponding to the tungsten oxide layer 80 of the sample device A, from which the differential curve in FIG. 10 corresponding to sample device A is derived, begins to protrude in the vicinity of point (iv). At the same time, it could also be seen that the spectrum in FIG. 9 exhibits a spectral protrusion near the Fermi surface, which is not found in a spectrum having the shape of an exponential function curve.

In other words, such a sample device A is characterized in that an occupied energy level near the Fermi surface is found in an area which is approximately 1.8 eV to 3.6 eV lower than the lowest energy level of a valence band of the hole injection layer 4, in terms of binding energy. More specifically, a spectral protrusion near the Fermi surface corresponding to the occupied energy level near the Fermi surface can be clearly seen in an area between a point which is approximately 2.0 eV lower than the lowest energy level of the valence band and another point which is approximately 3.2 eV lower than the lowest energy level of the valence band, in terms of binding energy, in the UPS spectrum corresponding to the sample device A.

Figure 11:
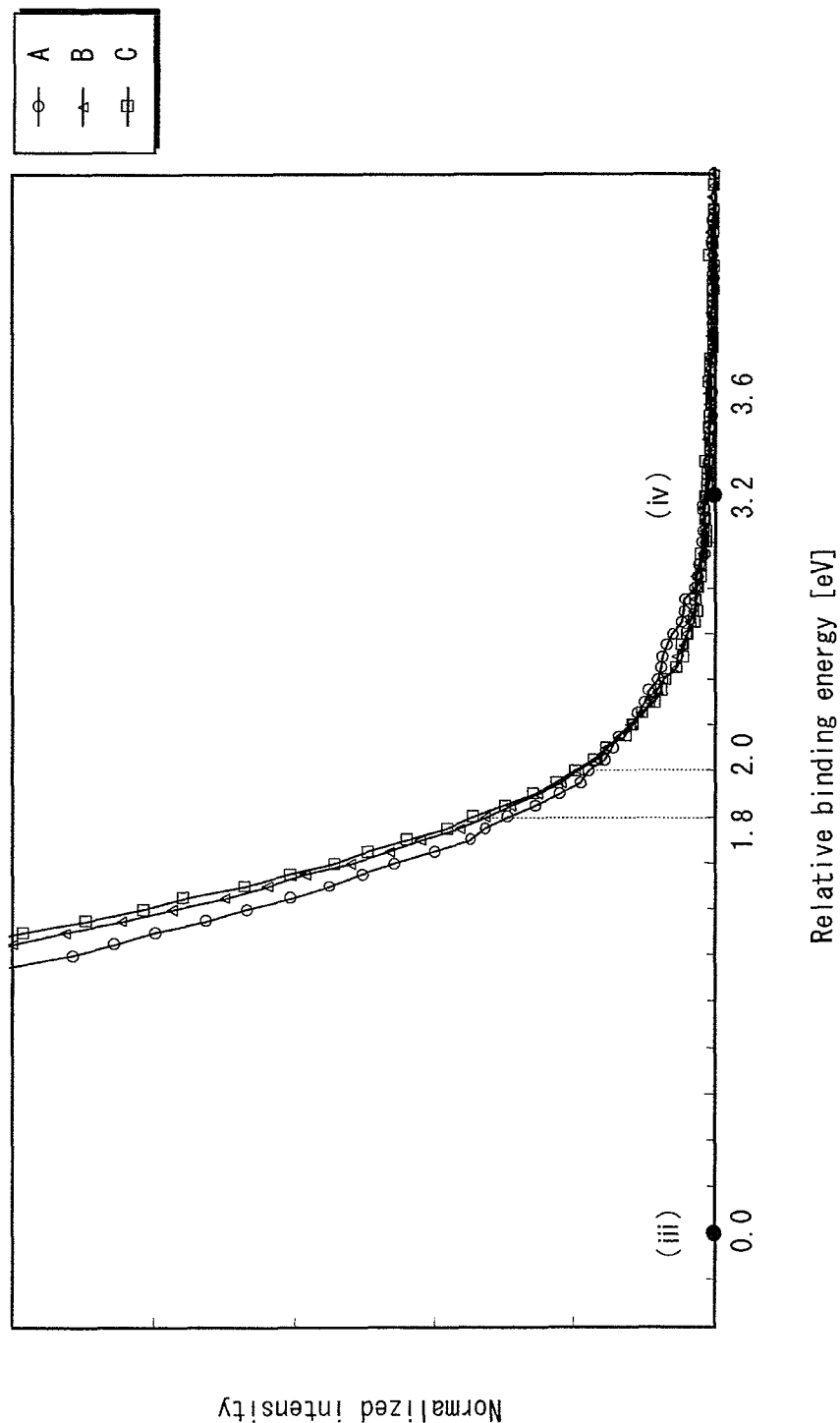
FIG. 11 illustrates UPS spectra of tungsten oxide that has been subjected to atmospheric exposure.

Next, the inventors conducted atmospheric exposure of the tungsten oxide layer 80 of each of the sample devices A, B, and C for a period of one hour at normal temperature. Note that the sample devices A, B, and C are the same sample devices as used in conducting the UPS measurement to obtain the UPS spectra in FIG. 9, and therefore have not been exposed to the atmosphere since the forming of the tungsten oxide layer 80. Following atmospheric exposure, the inventors conducted UPS measurement once again with respect to the tungsten oxide layer 80 of each of the sample devices A, B, and C. Observation was conducted focusing on the changes in the UPS spectrum corresponding to each of the sample devices A, B, and C. FIG. 11 illustrates UPS spectra which correspond to the sample devices A, B, and C within the area B in FIG. 8. The horizontal axis in FIG. 11 is similar to the horizontal axis in FIG. 9, and points (iii) and (iv) in FIG. 11 are provided at the same points on the horizontal axis as the respective points (iii) and (iv) in FIG. 9.

According to the UPS spectra illustrated in FIG. 11, the tungsten oxide layer 80 of each of the sample devices B and C do not exhibit the spectral protrusion near the Fermi surface. Thus, it has been seen that the UPS spectra corresponding to the sample devices B and C do not exhibit the spectral protrusion both before or after atmospheric exposure. Contrariwise, it can be seen that the tungsten oxide layer 80 of the sample device A still exhibits the spectral protrusion near the Fermi surface, although the spectrum differs in intensity and shape when compared to before atmospheric exposure. Hence, it is observed that the tungsten oxide layer 80 of the sample device A maintains the same characteristics as before atmospheric exposure, even after conducting exposure thereof to the atmosphere for a certain period of time. Therefore, it can be concluded that the tungsten oxide layer 80 of the sample device A has a certain level of stability with respect to ambient atmosphere.

In the above, description has been provided regarding the sample devices A, B, and C with focus on the respective UPS spectra obtained as a result of UPS measurement. However, it should be noted that the existence of the spectral protrusion near the Fermi surface is similarly observed when applying an XPS measurement or a hard X-ray photoemission spectroscopy measurement.

Figure 12:
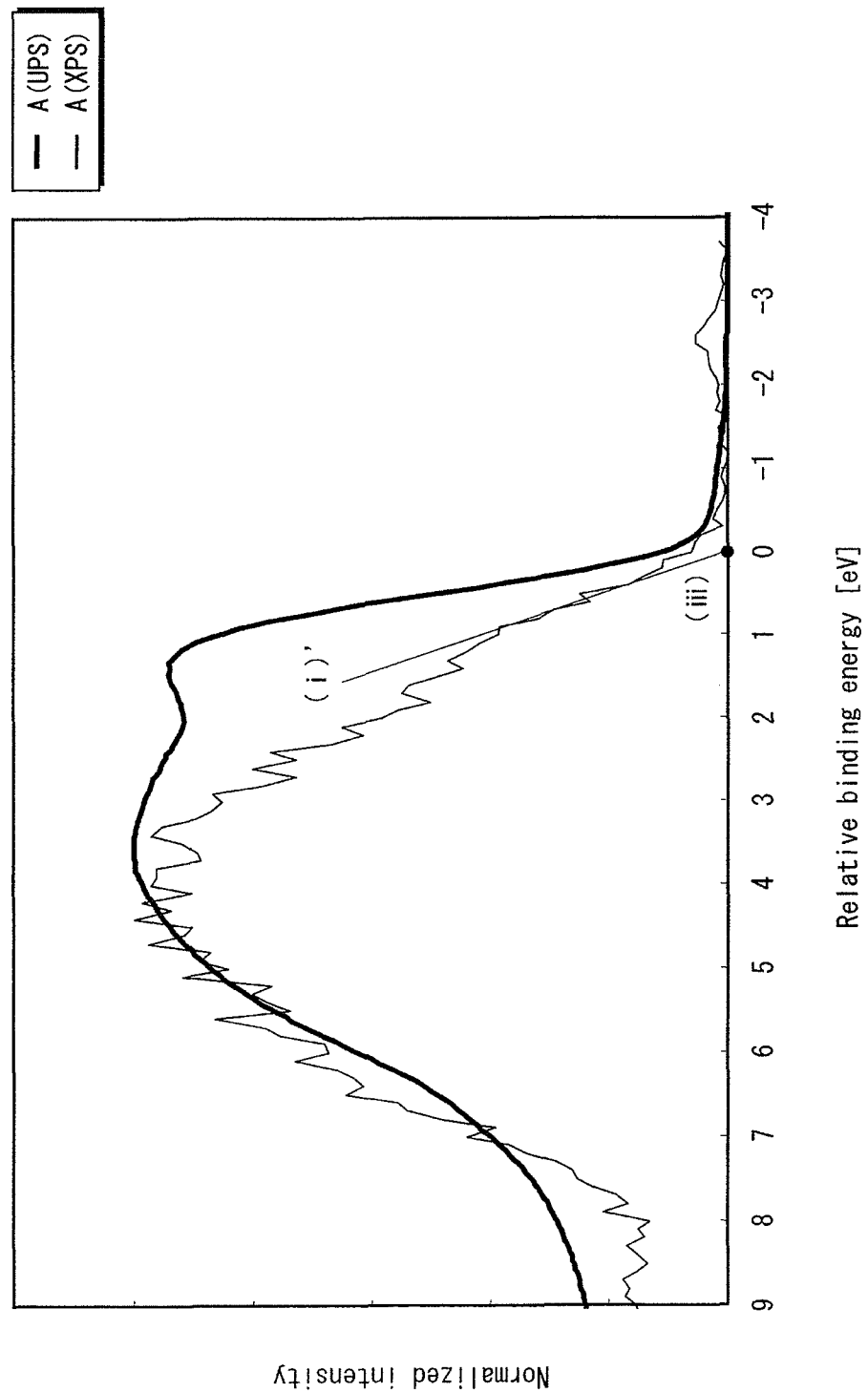
FIG. 12 illustrates both a UPS spectrum and an XPS spectrum of tungsten oxide pertaining to the present disclosure.

FIG. 12 illustrates an XPS spectrum of the tungsten oxide layer 80 of the sample device A after atmospheric exposure thereof. Note that, in FIG. 12, the XPS spectrum is overlaid with a UPS spectrum of the tungsten oxide layer 80 of the sample device A (the same UPS spectrum as illustrated in FIG. 8), so as to enable comparison between the two spectra.

The conditions under which the XPS measurement was conducted are similar to the conditions under which the UPS measurement was conducted as already described in the above, differing only in that an Al—K alpha line was used as the light source. In FIG. 12, point (iii) is provided at the same point on the horizontal axis as point (iii) in FIG. 8, and further, the horizontal axis indicates a relative binding energy with respect to point (iii). In addition, a line in the XPS spectrum corresponding to the line (i) in FIG. 8 is illustrated as line (i)' in FIG. 12.

As illustrated in FIG. 12, the spectral protrusion near the Fermi surface of the tungsten oxide layer 80 of the sample device A is found in the XPS spectrum, as well as in the UPS spectrum. In detail, in the XPS spectrum of the tungsten oxide layer 80 of the sample device A, the spectral protrusion near the Fermi surface is exhibited as a protrusion of a considerable degree within an area between a point which is approximately 1.8 eV lower than the lowest energy level of a valence band of the hole injection layer and another point which is 3.6 eV lower than the lowest energy level of the valence band of the hole injection layer, in terms of binding energy. Further, the spectral protrusion near the Fermi surface was similarly found when a hard X-ray photoemission spectroscopy measurement was conducted.

In the above, the sample device 1A (illustrated in FIG. 7) was used, instead of the organic EL element 1000 which is illustrated in FIG. 1, as the sample device for conducting the photoelectron spectroscopy measurements. The sample device 1A has a structure which differs from the organic EL element 1000, and is formed by disposing the tungsten oxide layer 80 on the conductive silicon substrate 70. Here, it should be noted that this measure has been taken merely for the sake of preventing the occurrence of charge-up, and thus, the structure of the organic EL element pertaining to the present disclosure is not to be limited thereby.

According to another experiment conducted by the inventors when UPS measurement and XPS measurement were conducted against a sample device having the structure of the organic EL element as illustrated in FIG. 1 (the structure where the anode 2 composed of ITO and the hole injection layer 4 composed of tungsten oxide are formed in the stated order on one surface of the substrate 1), the occurrence of charge-up was encountered during the measurements.

However, by using a neutralizing electron gun in such measurements, the occurrence of charge-up can be inhibited. When the neutralizing electron gun was used, there were cases where the absolute value of the binding energy indicated by each of the occupied energy levels of the hole injection layer 4 (for example, the binding energy value when the Fermi surface of the photoelectron spectroscopy device itself is determined as the reference point) differed from the corresponding value of the tungsten oxide layer 80 of the sample device 1A. However, a spectrum having a similar shape as the spectrum of the sample device 1A was obtained, at least within an area extending from the band gap energy level to the lowest energy level of the valence band, in terms of binding energy.

(Analysis concerning Hole Injection Efficiency)

The principle of the effect that the existence of the occupied energy level near the Fermi surface in the hole injection layer composed of tungsten oxide has on hole injection efficiency can be explained as provided in the following. Note that the existence of the occupied energy level near the Fermi surface is observed as the spectral protrusion near the Fermi surface in, for example, the UPS spectrum of the hole injection layer.

It has been frequently reported, with reference to results of experiments and first principles calculations, that existence of the occupied energy level near the Fermi surface, which can be seen in a thin film or a crystal of tungsten oxide, derives from oxygen vacancy or a structure similar thereto.

More specifically, assumption has been made that the existence of the occupied energy level near the Fermi surface derives from a binding orbital formed by 5d orbitals of adjacent tungsten atoms due to oxygen atom vacancy or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Non-Patent Literature 2). Here, explanation is provided concerning molybdenum oxide since molybdenum oxide has many common physical properties similar to those of tungsten oxide, such as a catalyst effect, electrochromism, and photochromism.

Further in detail, the inventors have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 13:
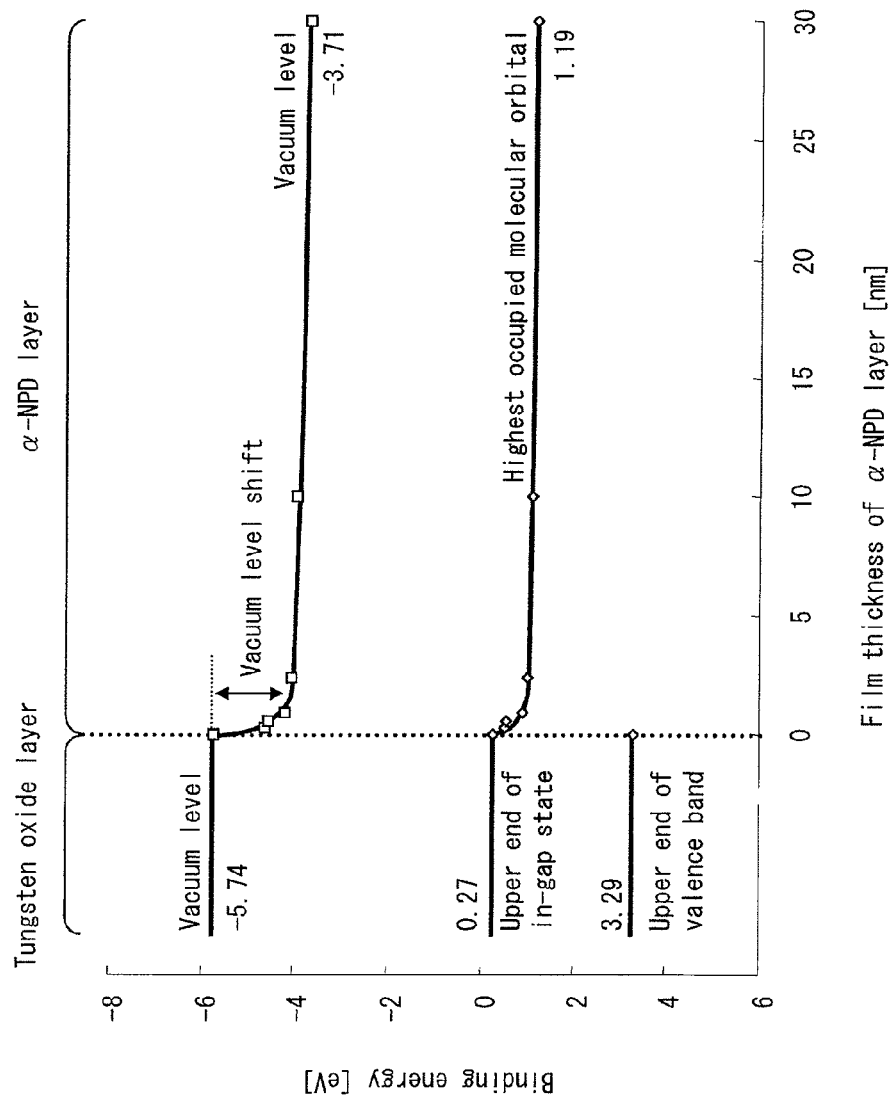
FIG. 13 is a diagram illustrating an energetic state at an interface between the tungsten oxide and α-NPD.

FIG. 13 is a diagram illustrating an energetic state at an interface between the tungsten oxide layer having the occupied energy level near the Fermi surface and an α-NPD layer.

FIG. 13 illustrates, with regards to the tungsten oxide layer (corresponding to the hole injection layer), the lowest binding energy of the valence band (illustrated as "upper end of the valence band" in FIG. 13) and the binding energy at the point at which the spectral rise near the Fermi surface begins (illustrated as "upper end of the in-gap state" in FIG. 13). Seen in relation to the UPS spectrum of the tungsten oxide layer, the upper end of the valence band in FIG. 13 corresponds to point (iii) in FIG. 8, and the upper end of the in-gap state in FIG. 13 corresponds to point (iv) in FIG. 9.

In addition, FIG. 13 illustrates a thickness of the α-NPD layer and a binding energy of the HOMO of the α-NPD, in a case where the α-NPD layer (corresponding to the functional layer) is disposed on the tungsten oxide layer. Furthermore, a vacuum level of each of tungsten oxide layer and the α-NPD layer is provided as well, in relation to the other energy levels illustrated. Here, the binding energy of the HOMO of the α-NPD layer corresponds to the binding energy at a point at which a peak of binding energy corresponding to the HOMO begins in the UPS spectrum of the α-NPD layer.

More specifically, the energy diagram illustrated in FIG. 13 is obtained through repeated alternate execution of the UPS measurement and ultra high vacuum vapor deposition, where the tungsten oxide layer formed on the ITO substrate is transferred back and forth between a photoelectron spectroscopy device and a ultra high vacuum vapor deposition device connected to the photoelectron spectroscopy device. Since the occurrence of charge-up was not encountered during the UPS measurement, the binding energy on the vertical axis in FIG. 13 is indicated as an absolute value taken with respect to a reference point, which is the Fermi surface of the ITO substrate.

It could be seen in FIG. 13 that, at least within a 0-0.3 nm distance from the surface of the α-NPD layer facing the tungsten oxide layer, or that is, in a vicinity of the interface between the tungsten oxide layer and the α-NPD layer, the upper end of the in-gap state of the tungsten oxide layer and the HOMO of the α-NPD layer are substantially equivalent in terms of binding energy. Thus, a state can be seen where, so to speak, the energy levels of the tungsten oxide layer and the α-NPD layer are in alignment with each other (hereinafter, this state is referred to as an "interface energy level alignment"). Here, it should be noted that the state of "substantially equivalent" as referred to in the above actually includes a state where a slight difference exists between the binding energies of the two layers, and denotes a range of ±0.3 eV inclusive, to be specific.

Further, it can be seen from FIG. 13 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large at around 2 eV, it could be reasonably assumed that the EDL has been formed as a result of some type of effect that is similar to a chemical bond. Thus, it can be reasonably assumed that the interface energy level alignment as mentioned above has been formed as a result of interaction between the tungsten oxide and the α-NPD.

Further, the inventors assume that the interaction, in specific, is caused by a mechanism as described in the following.

First of all, the occupied energy level near the Fermi surface derives from the 5d orbital of a tungsten atom, as description has already been made in the above. In the following, the 5d orbital of the tungsten atom is referred to as a "W5d orbital corresponding to the spectral protrusion".

When the HOMO of the α-NPD molecule approaches the W5d orbital corresponding to the spectral protrusion at the surface of the tungsten oxide layer, an electron transfers from the HOMO of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface between the tungsten oxide layer and the α-NPD layer, which brings about a vacuum level shift and an interface energy level alignment.

More specifically, many reports have been made, as a result of first principles calculations, that the HOMO of an α-NPD molecule is characterized in that: (i) the probability density thereof exhibits an uneven distribution of the HOMO near a nitrogen atom in an amine structure of the α-NPD molecule; and thus, (ii) the structure thereof includes, as the main composing element, a lone pair of electrons of a nitrogen atom. According to this, it could be assumed that, at the interface between the tungsten oxide layer and the layer of an organic amine-containing molecule, an electron transfers from the lone pair of electrons of the nitrogen atom in the amine structure of the amine-containing molecule to the W5d orbital corresponding to the spectral protrusion.

The fact that there are reports made of interface energy level alignments, similar to the interface energy level alignment between the tungsten oxide layer and the α-NPD layer illustrated in FIG. 13, at interfaces formed between a vapor deposition film of molybdenum oxide and each of α-NPD and F8BT supports this assumption (refer to Non-Patent Literatures 3, 4, and 5). Note that molybdenum oxide has a physical property similar to tungsten oxide, as description has already been made in the above, and further, α-NPD and F8BT are commonly organic amine-containing molecules.

The excellent hole injection efficiency of the hole injection layer of the organic EL element pertaining to the present disclosure can be explained according to the interface energy level alignment as described in the above. That is, an interface energy level alignment occurs between the hole injection layer composed of tungsten oxide that has the occupied energy level near the Fermi surface and the adjacent functional layer. As a result, the binding energy at the point at which the spectral protrusion corresponding to the occupied energy level near the Fermi surface begins and the binding energy of the HOMO of the functional layer become substantially equivalent. The injection of holes takes place between such energy levels having the interface energy level alignment formed therebetween. Therefore, the hole injection barrier to be overcome when injecting holes to the HOMO of the functional layer is minimized to such an extent as could be ignored.

However, as description has been already provided in the above, the occupied energy level near the Fermi surface is formed by factors such as oxygen vacancy and structures similar thereto, and further, it is quite unlikely, in reality, that tungsten oxide exists that is completely free of all such factors. Hence, for example, it can be reasonably assumed that, even in such tungsten oxide as used to prepare the above-mentioned sample devices B and C, which does not exhibit the spectral protrusion near the Fermi surface in the photoelectron spectroscopy spectrum, oxygen vacancy and structures similar thereto exist, however minimal they may be in terms of number.

In view of this, hereinafter, explanation is provided, with reference to FIG. 14, of the reason for which the hole-only element HOD-A and the organic EL element BPD-A, both having the hole injection layer 4 which corresponds to the tungsten oxide layer 80 of the sample device A, exhibit excellent hole injection efficiency as observed through the above experiments.

To bring about the interaction between the HOMO of the organic molecule composing the functional layer and the occupied energy level near the Fermi surface of the tungsten oxide layer when disposing the functional layer on the tungsten oxide layer, it is exemplary that the following condition be fulfilled. That is, it is exemplary that a portion of the organic molecule where the probability density of the HOMO is high, and an oxygen vacancy or a structure similar thereto of the tungsten oxide layer (illustrated as "injection site A" in FIG. 14) approach each other to a distance at which the interaction is triggered (fall into contact with each other). The portion of the organic molecule where the probability density of the HOMO is high (illustrated as "injection site B" in FIG. 14) is, for example, a nitrogen atom in the amine structure of an organic amine-containing molecule.

However, in a tungsten oxide layer as incorporated in the sample devices B and C, which does not exhibit the spectral protrusion near the Fermi surface, the number density of the injection site A, if any, is extremely small, as illustrated in FIG. 14B. Accordingly, the upward protrusion near the Fermi surface does not appear in the UPS spectra thereof. Thus, the possibility of the injection site A and the injection site B falling into contact is extremely low. Since the injection of holes takes place where the injection site A and the injection site B fall into contact, it is clear that hole injection efficiency in sample devices B and C is extremely low.

In contrast to this, an abundance of injection sites A exists in the tungsten oxide layer which exhibits the spectral protrusion near the Fermi surface, as illustrated in FIG. 14A. Note that the tungsten oxide layer exhibiting the spectral protrusion near the Fermi surface is, for example, the tungsten oxide layer incorporated in the above-mentioned sample device A. Thus, there is a high possibility of the injection sites A and the injection sites B falling into contact, and therefore the tungsten oxide layer exhibits excellent hole injection efficiency.

When summarizing the description provided in the above, the excellent hole injection efficiency of the organic EL element pertaining to the present disclosure can be explained as follows.

Firstly, a hole injection layer composed of tungsten oxide exhibits, in the photoelectron spectroscopy spectrum thereof, an upward protrusion near the Fermi surface. Such a spectral protrusion near the Fermi surface is indicative of a considerable number of oxygen vacancies and structures similar thereto existing at the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the highest occupied molecular orbital (HOMO) of the organic molecule.

As such, if a considerable number of oxygen vacancies and structures similar thereto are found at the surface region of the hole injection layer, the possibility increases of the occupied energy level near the Fermi surface and a portion of the organic molecule having a high probability density of the HOMO falling into contact with each other. Thus, the interface energy level alignment occurs efficiently, and accordingly, the tungsten oxide layer exhibits excellent hole injection efficiency.

(Film Thickness Reduction of the Hole Injection Layer)

So as to observe the characteristics of an organic EL element having undergone the bank forming process, the inventors conducted an experiment by newly preparing the organic EL element 1000 (illustrated in FIG. 1), which has the banks 5 formed therein. Note that the organic EL element 1000 prepared by the inventors here differs from the above-described assessment devices (which have structures where the banks 5 are omitted therefrom). As a result of the experiment conducted by using the organic EL element 1000 having the banks 5 formed therein, the inventors have confirmed that the newly prepared organic EL element 1000 having the banks 5 formed therein can be driven at a low voltage similar as the above-described assessment devices, and further, that the newly prepared organic EL element 1000 having the banks 5 formed therein has enhanced light-emitting characteristics.

However, when checking the organic EL element 1000 so prepared, the inventors found that, upon completion of the organic EL element 1000, the thickness of the hole injection layer included therein has decreased compared to immediately after the forming of the hole injection layer (the reduction in the thickness of the hole injection layer is referred to hereinafter as "film thickness reduction"). Confronting such a situation, the inventors made an assumption that this film thickness reduction of the hole injection layer takes place during the bank forming process. Based on such an assumption, the inventors conducted a confirmation experiment as described in the following so as to investigate the cause of the film thickness reduction of the hole injection layer.

As for the specific method according to which the confirmation experiment was conducted, the inventors prepared each of sample devices A through C as described in the following. First, the inventors formed a film composed of tungsten oxide, which is to become the hole injection layer, on a glass substrate by sputtering (the film forming conditions applied in forming the tungsten oxide films in the sample devices A through C were the same as the film forming conditions applied in the forming of the above-described hole-only devices). Subsequently, the inventors formed a resin material layer composed of a predetermined resin material ("TFR" series resin material produced by Tokyo Ohka Kogyo Co., Ltd.) so as to be layered on the hole injection layer by applying the spin coating method (room temperature, 2500 rpm/25 sec) and by performing baking (100° C., 90 sec). Following this, development processing (where a solution including 2.38% TMAH was used and where the developing time was 60 sec) and cleaning processing (where pure water was used and where the cleaning time was 60 sec) were performed. Successively, the resin material layer having been layered on the hole injection layer was removed. The forming of the resin material layer, the development processing, and the cleaning processing were performed so as to simulate the bank forming processing performed when an organic EL element is actually manufactured.

Figure 15:
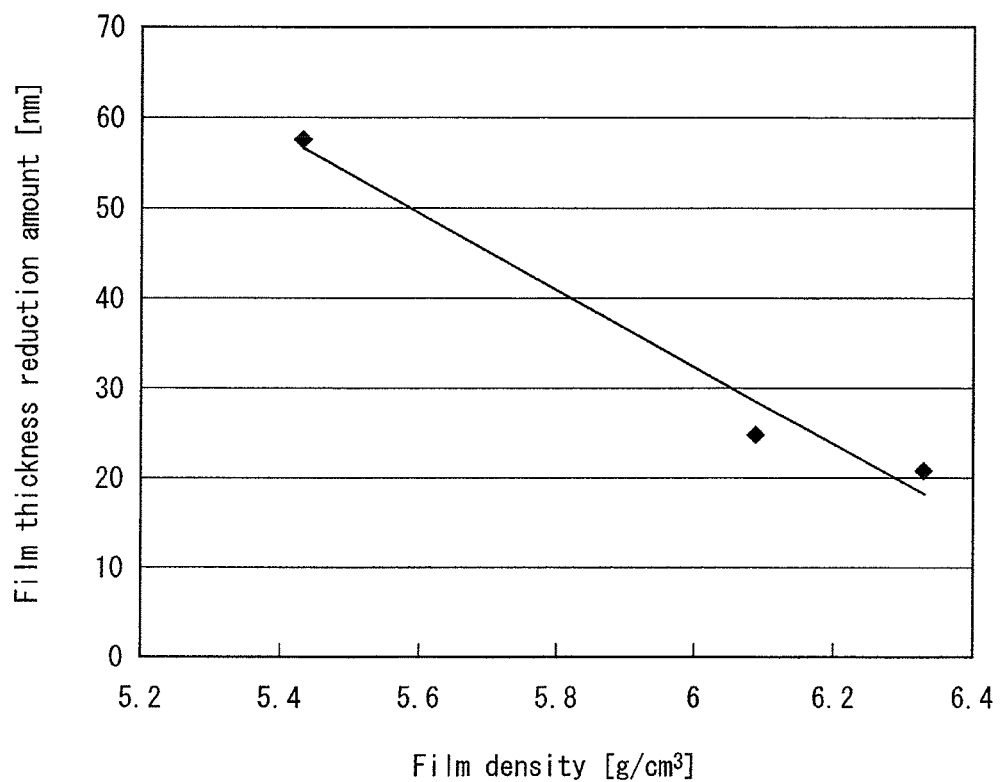
FIG. 15 is a graph illustrating a relation between film thickness reduction amount and film density.

Table 5 indicates the film forming conditions applied and the results of the experiment. Further, FIG. 15 illustrates a graph indicating a relation between the film densities and the film thickness reduction amounts indicated in Table 5.

TABLE 5

|  | Sample Device | | |
| --- | --- | --- | --- |
|  | Sample Device A | Sample Device B | Sample Device C |
| Total Pressure (Pa) | 4.8 | 2.7 | 2.7 |
| Ar:O$_2$ | 100:100 | 43:100 | 43:100 |
| Input Power (W) | 250 | 500 | 1000 |
| Film Density (g/cm$^3$) | 5.43 | 6.09 | 6.33 |
| Film Thickness Reduction Amount (nm) | 57.7 | 25 | 20.9 |
| Remarks/Film Forming Device | SMD | SOLCIET | SOLCIET |

As is indicated by the experiment results presented in Table 5, in each of the sample devices A through C, a change was observed in the film thickness of the tungsten oxide layer, which corresponds to the hole injection layer. In specific, the film thickness of the tungsten oxide layer in the sample device A, which was 80 nm at a point immediately following the forming thereof, decreased to 23 nm by the end of the experiment. As such, it was observed that the film thickness of the tungsten oxide layer in sample A decreased by as much as approximately 57 nm due to occurrence of the film thickness reduction (reference is made to sample A, which exhibited the best characteristics among the sample devices A through C).

Further, the inventors also found that there was a considerable level of correlation between an amount of a tungsten oxide layer decreasing as a result of the film thickness reduction (hereinafter referred to as a "film thickness reduction amount") and a film density of the tungsten oxide layer. More specifically, the inventors found that, when a tungsten oxide layer had a relatively low film density, the film thickness reduction amount of the tungsten oxide layer indicated a relatively great value.

The reason as to why such a correlation exists between the film thickness reduction amount and the film density of a tungsten oxide layer is still not clear at the present point. However, it has been confirmed from Tables 4 and 5 and from the graph illustrated in FIG. 15 that a film density of a tungsten oxide layer having relatively high film characteristics, such as light-emitting characteristics, is relatively low compared to a film density of a tungsten oxide layer having relatively low film characteristics. Further, the inventors, through conduction of a separate consideration, have reached an assumption that a tungsten oxide layer can contribute in realizing low voltage drive of an organic EL element including the tungsten oxide layer when the tungsten oxide layer has a relatively low film density due to having the above-described structure deriving from oxygen vacancy therein and when, as a result, the tungsten oxide layer exhibits excellent hole injection efficiency.

In addition, as a result of investigation performed by the inventors, it has been found that the film thickness reduction of a tungsten oxide layer takes place as a result of the tungsten oxide layer dissolving to a dissolution liquid used in the development processing or a dissolution liquid used in the cleaning processing. As description has been provided above, a film density of a tungsten oxide layer is relatively low when the tungsten oxide layer has the above-described structure deriving from oxygen vacancy therein. It can be assumed that this is due to a great amount of minute crystalline structures being formed within a tungsten oxide layer having the above-described structure deriving from oxygen vacancy therein. Further, it is assumed that, when a great amount of minute crystalline structures are formed in a tungsten oxide layer as described above, a dissolution liquid (a developing solution, a cleaning liquid, etc.) used in the film forming process during the forming of banks readily permeates the tungsten oxide layer, and thereby causes the film thickness reduction to take place.

Generally speaking, it can be considered that the occurrence of the film thickness reduction of a tungsten oxide layer as described above leads to difficulty in the management of the film thickness of the tungsten oxide layer, and further, leads to a risk of the hole injection characteristics of the hole injection layer, upon completion of an organic EL element including the hole injection layer, being affected in some way. As such, it can be assumed that, if a person skilled in the art should recognize the problem of the film thickness reduction of a hole injection layer as described above, the person skilled in the art would hesitate to use tungsten oxide for forming the hole injection layer.

However, the inventors, though much devotion and consideration, have found that the film thickness reduction amount of a tungsten oxide layer can be adjusted, for example, by changing the conditions according to which developing is performed (reducing the concentration of a developing solution to be used in the developing from 2.38% to around 0.2%) or by making appropriate changes to the conditions under which baking is performed. By making such changes, the thickness of a tungsten oxide layer can be controlled while taking into consideration the occurrence of the film thickness reduction. As such, the inventors conducted further consideration concerning how a sample of a light-emitting element having a higher level of practicability can be manufactured while relying upon the above-described technology pertaining to the adjustment of the film thickness reduction amount of a hole injection layer, and as a result, have confirmed the technical matters as presented in the following.

As the first step in manufacturing a sample of a light-emitting element having a higher level of practicability, the inventors formed a hole injection layer including tungsten oxide on an anode. Subsequently, the inventors disposed a bank material layer so as to be layered on the hole injection layer, and then, performed patterning with respect to the bank material layer so as to provide the bank material layer with a predetermined shape including an opening for foaming a functional layer (at this point, exposure, development, and cleaning are each performed). Subsequently, the inventors formed the functional layer at a position corresponding to the above-described opening. Finally, the inventors formed a cathode on the functional layer.

When analyzing the structure of the sample light-emitting element manufactured in accordance with the above-described method, the inventors found that, at a region of the hole injection layer corresponding to the above-described opening, a depression was formed by dissolution of tungsten oxide. Due to such a depression being formed, the hole injection layer, as a whole, was formed so as to have a recessed structure.

Based on this finding and by focusing on a recessed portion of the hole injection layer, which is surrounded by an inner bottom surface and an inner side surface, the inventors arrived at the conception that, by applying ink material for forming the functional layer to an entire inner surface of the recessed portion, the wettability of the functional layer can be enhanced, which results in the functional layer being formed so as to have excellent characteristics.

As such, the inventors arrived at a structure of an organic EL element where, within an area of the hole injection layer defined by banks, a surface of the hole injection layer facing the functional layer has a recessed structure, and further, the recessed structure has a recessed portion whose inner surface is in contact with the functional layer, as description is provided in embodiment 2 of the present disclosure presented in the following.

In the following, description is provided on another embodiment of the present disclosure while focusing on aspects differing from embodiment 1.

<Embodiment 2>

(Overall Structure of Light-Emitting Element)

Figure 16:
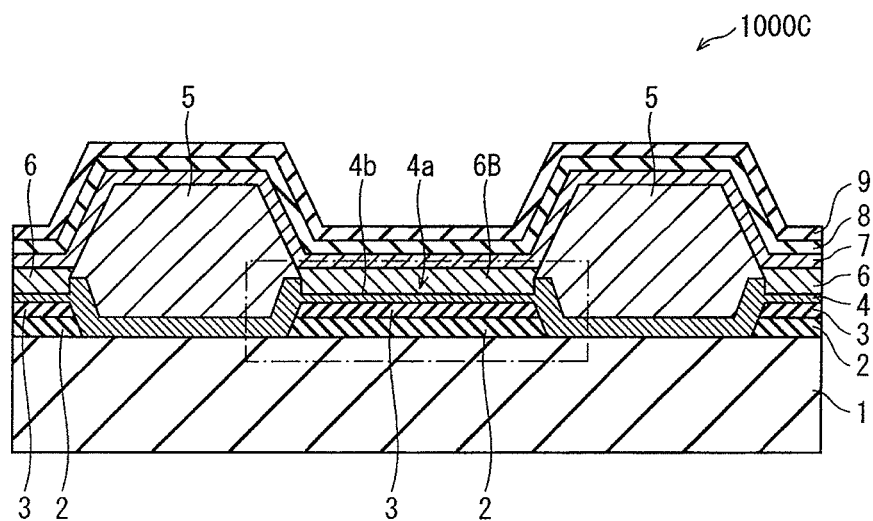
FIG. 16 is a schematic view illustrating a layered state of layers of a light-emitting element pertaining to embodiment 2 of the present disclosure.
Figure 17:
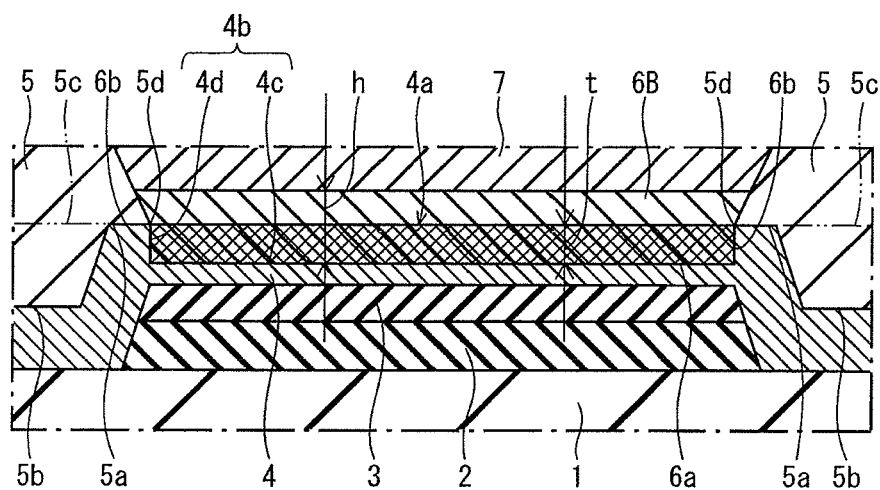
FIG. 17 is an enlarged view of a part surrounded by dashed-dotted lines in FIG. 16.

FIG. 16 is a schematic view illustrating a layered state of layers of a light-emitting element 1000C pertaining to embodiment 2. FIG. 17 is an enlarged view of a part surrounded by dashed-dotted lines in FIG. 16.

As illustrated in FIG. 16, the light-emitting element 1000C is a top emission type organic light-emitting element in which pixels corresponding to the colors R, G, and B are arranged so as to form lines or to form a matrix. Further, each pixel has a layered structure where various layers are layered above the substrate 1.

The light-emitting element 1000C differs from the organic EL element 1000 in embodiment 1 in that, in the light-emitting element 1000C, the hole injection layer 4 is disposed on an upper surface of an anode (the anode 2) with an ITO layer 3 interposed therebetween. In addition, the light-emitting element 1000C also differs from the organic EL element 1000 in embodiment 1 in that (i) the buffer layer is not included, (ii) an electron injection layer 7 is disposed on the light-emitting layer 6B, and (iii) a sealing layer 9 is disposed on the cathode 8.

On the substrate 1, the anode 2 is formed so as to form lines or to form a matrix. On the anode 2, an indium tin oxide (ITO) layer 3 and the hole injection layer 4, which functions as a charge injection transport layer, are layered in the stated order. Note that, while the ITO layer 3 is layered only on the anode 2, the hole injection layer 4 is formed not only above the anode 2 but also across an entire upper surface of the substrate 1.

On the hole injection layer 4, banks 5 that define pixels are formed, and in a region defined by the banks 5, the light-emitting layer 6B is disposed. Furthermore, on the light-emitting layer 6B, the electron injection layer 7, the cathode 8, and the sealing layer 9 are formed so as to extend over the regions defined by the banks 5 to be continuous between adjacent pixels.

Each of the regions defined by the banks 5 has a multi-layer structure in which the ITO layer 3, the hole injection layer 4, the light-emitting layer 6B, and the electron injection layer 7 are layered in the stated order, thereby forming the functional layer. Note that, the functional layer may include other layers such as the hole transport layer and the electron transport layer.

(Constituent Components of Light-emitting Element)

The anode 2 has a single layer structure in the light-emitting element 1000C and is composed of Ag (silver). Note that the anode 2 may be formed with APC (alloy of silver, palladium, and copper), ARA (alloy of silver, rubidium, and gold), MoCr (alloy of molybdenum and chromium), NiCr (alloy of nickel and chromium), etc. In the case of a top emission type light-emitting element, for example, the anode 2 may be formed with a light-reflective material.

The ITO layer 3 is interposed between the anode 2 and the hole injection layer 4, and has the function of enhancing the bonding between the anode 2 and the hole injection layer 4.

The hole injection layer 4 is similar to that in embodiment 1, and is a layer composed of tungsten oxide (WOx) that is formed under film forming conditions yielding a hole injection layer having excellent hole injection characteristics. The hole injection layer 4, being formed by using such a material, has liquid-philicity compared to the surfaces of the banks 5.

(Hole Injection Layer)

As illustrated in FIG. 17, the hole injection layer 4 extends along the bottom surfaces of the banks 5 in the direction of adjacent pixels. Also, within a region defined by the banks 5, the hole injection layer 4 has a recessed structure such that the hole injection layer 4 is lower in level than the bottom surfaces of the banks 5, and includes a recessed portion 4a (indicated with meshed hatching in FIG. 17) formed by being dissolved by a predetermined dissolution liquid. In addition, the film thickness of the hole injection layer 4 within the region defined by the banks 5 is smaller than the film thickness of the hole injection layer 4 in other regions thereof, and further, the film thickness of the hole injection layer 4 in the other regions is substantially uniform throughout the entirety of the other regions. Since the hole injection layer 4 is formed with a metal compound having liquid-philicity, an inner surface 4b of the recessed portion 4a has excellent wettability to ink. Accordingly, this allows for ink deposited with respect to the region of the hole injection layer 4 defined by the banks 5 to easily adhere to the inner surface 4b of the recessed portion 4a, and further, the possibility is higher of deposited ink remaining within the region defined by the banks 5.

Note that, the hole injection layer 4 need not have a recessed structure such that the recess portion 4a is lower in level than the entire bottom surface of the banks 5. That is, the recessed structure suffices if the recessed portion 4a is lower in level than a peripheral portion 5a of the bottom surface of the banks 5. In the present embodiment, the hole injection layer 4 has a recessed structure such that the recessed portion 4a is lower in level than the peripheral portion 5a of the bottom surface of the banks 5 but not lower than a central portion 5b of the bottom surface of the banks 5. However, the hole injection layer 4 may alternatively have a recessed structure such that, for example, by setting the central portion 5b at the same level as the peripheral portion 5a and by planarizing the bottom surface of the banks 5 as indicated by the chained double-dashed line 5c in FIG. 17, the recessed portion 4a is lower in level than the entire bottom surface of the banks 5.

The hole injection layer 4 has a recessed structure falling lower in level starting from a portion corresponding to a bottom periphery 5d of the banks 5. To be specific, a region of an upper surface of the hole injection layer 4, which is defined by the banks 5, depresses in a direction substantially vertical to the upper surface of the substrate 1 from the portion corresponding to a bottom periphery 5d. When the hole injection layer 4 has a recessed structure falling lower in level starting from the portion corresponding to the bottom periphery 5d, the film thickness of the light-emitting layer 6B can be uniformed over a wide range, and as a result, the risk of irregular luminance occurring in the light-emitting layer 6B is reduced.

Figure 18:
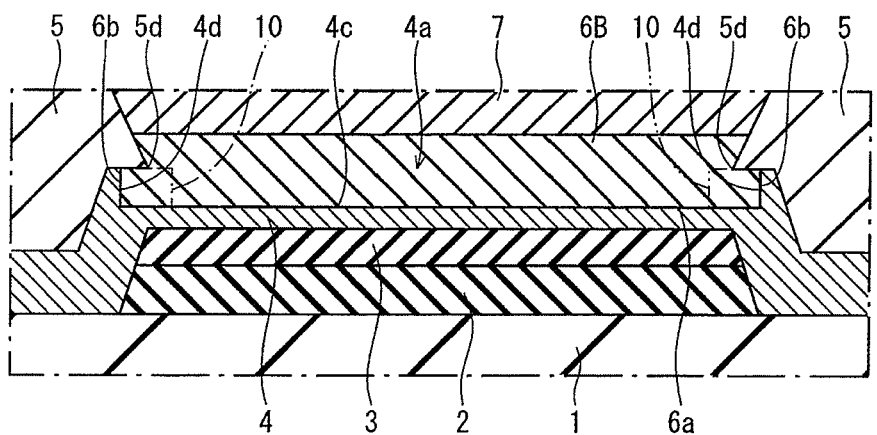
FIG. 18 is an enlarged view of the part surrounded by dashed-dotted lines in FIG. 16 in a light-emitting element pertaining to a modification.

Note that the present disclosure is not limited to the hole injection layer 4 having a recessed structure falling lower in level starting from the portion corresponding to the bottom periphery 5d. For instance, alternatively, the hole injection layer 4 may have a recessed structure falling lower in level starting from a portion closer to an adjacent pixel than the portion corresponding to the bottom periphery 5d of the banks 5, as illustrated in FIG. 18. Alternatively, the hole injection layer 4 may have a recessed structure falling lower in level starting from a portion closer to a central portion of the pixel than the portion corresponding to the bottom periphery 5d of the banks 5. In such a case, the recessed portion 4a has a profile as indicated by the chained double-dashed line 10 in FIG. 18.

In addition, the recessed structure of the hole injection layer 4 has a cup-like shape. To be more specific, an inner surface 4b of the recessed portion 4a is composed of an inner bottom surface 4c and an inner side surface 4d. The inner bottom surface 4c is planar and substantially parallel with the upper surface of the substrate 1, and is in contact with a bottom surface 6a of the light-emitting layer 6B. The inner side surface 4d extends from a periphery of the inner bottom surface 4c in a direction substantially perpendicular to the upper surface of the substrate 1, and is in contact with a side surface 6b of the light-emitting layer 6B. When the recessed structure has a cup-like shape as described above, the inner side surface 4d prevents ink deposited to within the recessed portion 4a from moving in a direction parallel to the upper surface of the substrate 1. Accordingly, it is possible to more stably hold deposited ink within the region defined by the banks 5. Moreover, when the recessed structure has the cup-like shape as described above, the inner surface 4b of the recessed portion 4a becomes larger in area, and a contact surface between deposited ink and the hole injection layer 4 becomes larger in area. Accordingly, it is possible to more stably hold deposited ink within the region defined by the banks 5. Therefore, patterning of the light-emitting layer 6B can be performed with high precision.

Figure 19:
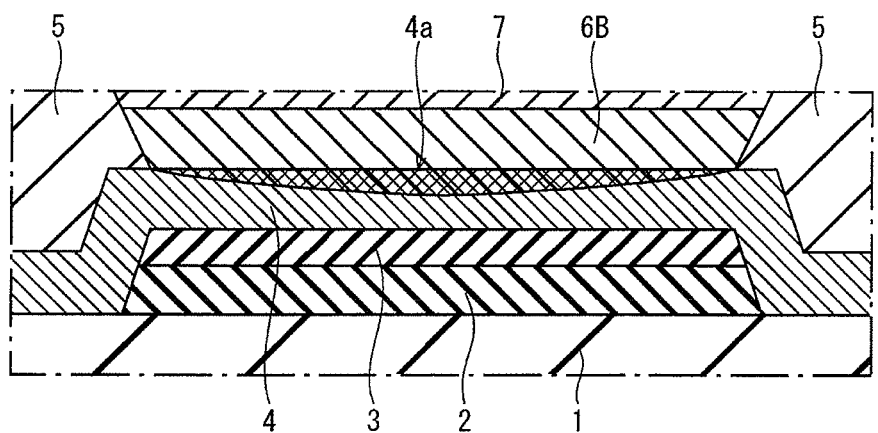
FIG. 19 is an enlarged view of the part surrounded by dashed-dotted lines in FIG. 16 in a light-emitting element pertaining to a modification.

Note that the hole-injection layer 4 is not limited to having a recessed structure having a cup-like shape as described above. That is, as illustrated in FIG. 19, a cross-sectional shape of the recessed portion 4a (indicated with mesh hatching in FIG. 19) may have a plate-like shape such as a substantially fan-shape and a substantially V shape.

Returning to FIG. 17, although the present disclosure does not intend to specifically specify an average depth t of the recessed portion 4a, the average depth t may be 5-100 nm, for example. If the average depth t of the recessed portion 4a is set to be equal to or greater than 5 nm, it is possible to hold a sufficient amount of deposited ink within the recessed portion 4a. Accordingly, it is possible to stably maintain deposited ink within the region defined by the banks 5. Furthermore, since the light-emitting layer 6B is formed so as to reach a periphery of the banks 5 without being repelled when the average depth t of the recessed portion 4a is set to be equal to or greater than 5 nm, short circuit between the anode 2 and the cathode 8 can be prevented.

Note that, the average depth t of the recessed portion 4a can be obtained by measuring a surface profile of the hole injection layer 4 with use of a stylus profiler meter or an AFM (Atomic Force Microscope) and calculating a difference between an average height of peak portions of the surface profile and an average height of bottom portions of the surface profile.

In the meantime, the present disclosure does not specifically specify the film thickness of the light-emitting layer 6B. However, when an average film thickness h of the light-emitting layer 6B after drying is set to be equal to or greater than 100 nm and the average depth t of the recessed portion 4a is set to be equal to or smaller than 100 nm, for example, it is possible to uniform the film thickness of the light-emitting layer 6B within the region defined by the banks 5.

Figure 20A:
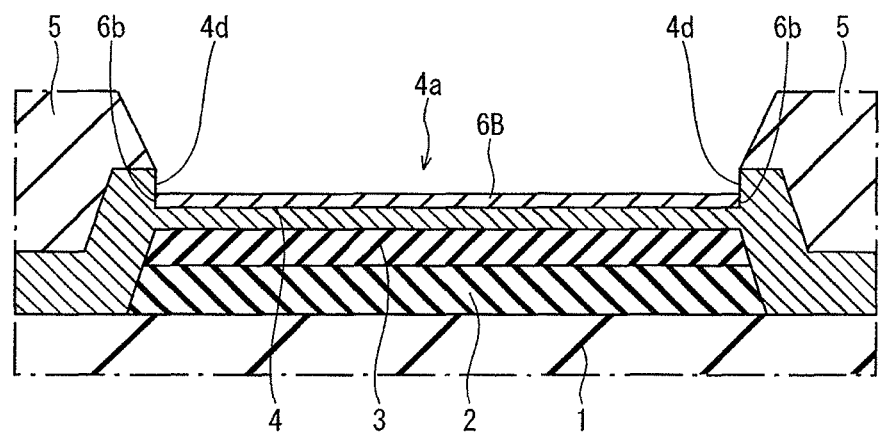
FIGS. 20A and 20B are schematic views for explaining an optimum thickness of a light-emitting layer.
Figure 20B:
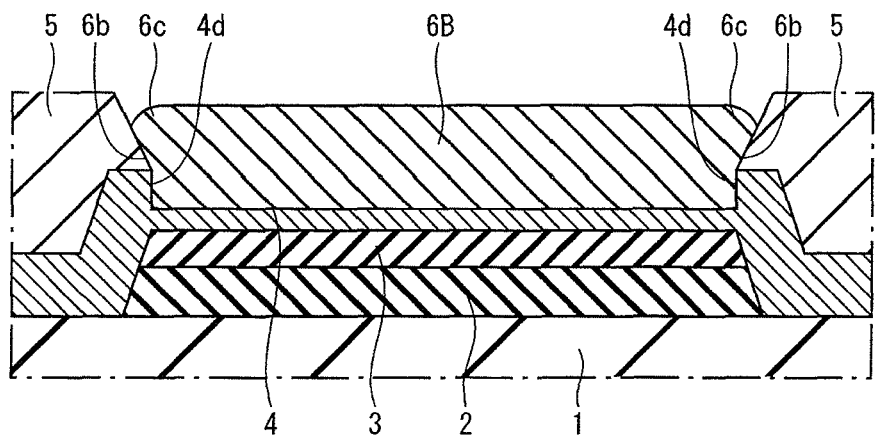

Furthermore, for example, a difference between the average film thickness h of the light-emitting layer 6B and the average depth t of the recessed portion 4a may be set to be equal to or smaller than 20 nm. When the average film thickness h of the light-emitting layer 6B is excessively smaller than the average depth t of the recessed portion 4a (for example, when t−h>20 nm), a portion of the inner side surface 4d of the recessed portion 4a does not come in contact with the light-emitting layer 6B (a portion onto which the light-emitting layer 6B has not been applied), as illustrated in FIG. 20A. Then a short circuit might occur between the anode 2 and the cathode 8 at that portion. On the other hand, when the average film thickness h of the light-emitting layer 6 is excessively greater than the average depth t of the recessed portion 4a (for example, h−t>20 nm), liquid-repellency of the banks 5 causes a film thickness of a bank vicinity portion 6c of the light-emitting layer 6B to become smaller than other portions of the light-emitting layer 6B, as illustrated in FIG. 20B. As a result, the light-emitting layer 6B is formed to have a substantially convex cross-sectional shape, which may result in unevenness in light emission caused by difference in film thickness.

Note that, the inner side surface 4d of the recessed portion 4a needs to be in contact with only at least a part of the side surface 6b of the light-emitting layer 6B. For example, as illustrated in FIG. 17 and FIG. 20B, when the average film thickness h of the light-emitting layer 6B is equal to or greater than the average depth t of the recessed portion 4a, the inner side surface 4d of the recessed portion 4a is in contact with only a lower part of the side surface 6b of the light-emitting layer 6B. On the other hand, as illustrated in FIG. 20A, when the average film thickness h of the light-emitting layer 6B is smaller than the average depth t of the recessed portion 4a, the side surface 6b of the light-emitting layer 6B is entirely in contact with the inner side surface 4d of the recessed portion 4a.

Figure 21:
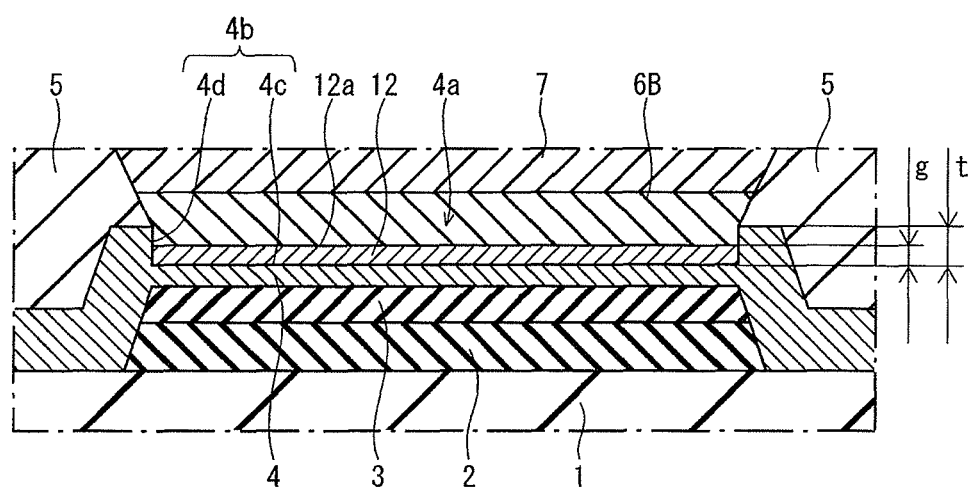
FIG. 21 is an enlarged view of the part surrounded by dashed-dotted lines in FIG. 16 in a light-emitting element pertaining to a modification.

As illustrated in FIG. 21, in the recessed portion 4a of the hole injection layer 4, a liquid-philic layer 12 such as an IL layer (intermediate layer) may be formed under the light-emitting layer 6B. In this case, ink is deposited not on the inner bottom surface 4c of the recessed portion 4a but on an upper surface 12a of the liquid-philic layer 12. Even in such a case, since the upper surface 12a of the liquid-philic layer 12 is liquid-philic, it is possible to stably hold deposited ink within the region defined by the banks 5. However, when the liquid-philic layer 12 fills the recessed portion 4a completely, the inner side surface 4d of the recessed portion 4a no longer comes into contact with deposited ink. As such, for example, an average film thickness g of the liquid-philic layer 12 may be set so as to be smaller than the average depth t of the recessed portion 4a.

The hole transport layer 12 is a layer having a thickness of about 10 nm to 20 nm and has a function of transporting, into the organic light-emitting layer 6B, holes injected from the hole injection layer 4. The hole transport layer 12 is formed with organic material having hole-transporting characteristics. Organic material having hole-transporting characteristics as described above refers to organic material having characteristics of conveying holes having been generated by making use of a charge transfer effect occurring between molecules. Organic material having such characteristics is also referred to as a p-type semiconductor.

The hole transport layer 12 may be formed with either high molecular material or low molecular material, and is formed by application of a wet printing process. In addition, for example, the hole transport layer 12 may include a crosslinking agent, which prevents the hole transport layer 12 from dissolving and flowing out into the organic light-emitting layer 6B formed thereon upon forming of the organic light-emitting layer 6B. Examples of material having hole-transporting characteristics that may be utilized include a copolymer containing a fluorene unit and a triarylamine unit, and a triarylamine derivative having low molecular weight. One example of the crosslinking agent that may be utilized is dipentaerythritol hexaacrylate. In this case, for example, the hole transport layer 12 may be formed with poly(3,4-ethylenedioxythiophene) doped with poly(styrenesulfonate) (PEDOT-PSS) or a derivative thereof (copolymer or the like).

The banks 5 are formed with organic material such as resin or inorganic material such as glass and has insulating properties. Examples of organic material that can be used for forming the banks 5 include: acrylic resin; polyimide resin; and novolac type phenolic resin. Examples of inorganic material that can be used for forming the banks 5 include: SiO, (silicon dioxide) and $Si_3N_4$ (silicon nitride). For example, the banks 5 may have organic solvent resistance and may have a certain level of light transparency to visible light. Further, since there are cases where the banks 5 undergo etching, baking and other similar processing, for example, the banks 5 be formed may by using a material having a high degree of resistance against such processing.

In addition, at least the surfaces of the banks 5 are provided with liquid-repellency. As such, when forming the banks 5 with liquid-philic material, it is exemplary to provide the surfaces of the banks 5 with liquid-repellency by performing a liquid-repellent treatment or the like.

Note that the banks 5 may be formed so as to form a pixel bank structure or may be formed so as to form a line bank structure. When the banks 5 are formed so as to form a pixel bank structure, the banks 5 are formed so as to surround the light-emitting layer 6B corresponding to one subpixel from all directions. On the other hand, when the banks 5 are formed so as to form a line bank structure, the banks 5 are formed so as to partition pixels by columns or by rows. Further, in a line bank structure, the banks 5 exist at both sides of the light-emitting layer 6B in either the row direction or in the column direction. When the banks 5 form a line bank structure, the light-emitting layer 6B is formed so as to be continuous in either the column direction or the row direction.

The electron injection layer 7 has a function of transporting electrons injected from the cathode 8 to the light-emitting layer 6B. For example, the electron injection layer 7 may be formed by using, for example, barium, phthalocyanine, lithium fluoride or any mixture of such materials, etc.

The cathode 8 is formed so as to have a single-layer structure by using, for example, ITO, IZO (indium zinc oxide) or the like. Further, for a top emission type light-emitting element, for example, the cathode 8 may be formed by using light-transmissive material.

The sealing layer 9 inhibits the light-emitting layer 6B and the like from being exposed to moisture, air, etc., and is formed by using material such as SiN (silicon nitride) and SiON (silicon oxynitride). Further, for a top emission type light-emitting element, for example, the sealing layer 9 may be formed by using light-transmissive material.

<Manufacturing Method of Light-Emitting Element 1000C>

FIGS. 22A-22D each illustrate a procedure in a manufacturing method of the light-emitting element pertaining to embodiment 2. Further, FIGS. 23E-23H each illustrate a procedure, following the procedures illustrated in FIGS. 22A-22D, in the manufacturing method of the light-emitting element pertaining to embodiment 2.

Figure 22A:
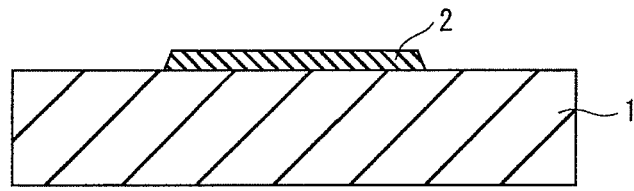
FIGS. 22A-22D each illustrate a procedure in a manufacturing method of the light-emitting element pertaining to embodiment 2.

In the manufacturing procedures of the light-emitting element 1000C, first, as illustrated in FIG. 22A, the anode 2 is formed so as to form lines or to form a matrix by forming a thin film of Ag on the substrate 1, for example, by sputtering and further by patterning the Ag thin film, for example, by photolithography. Alternatively, the Ag thin film may be formed by application of a vacuum deposition method or the like.

Figure 22B:
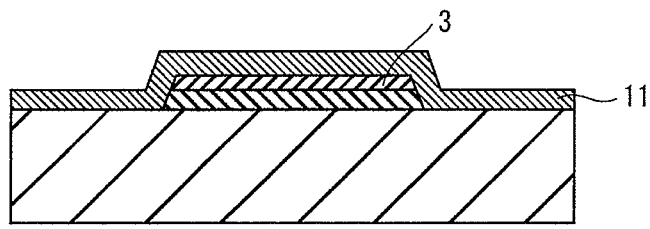

Next, as illustrated in FIG. 22B, an ITO thin film is formed by, for example, sputtering, and then the ITO layer 3 is formed by patterning the ITO thin film by photolithography, for example.

Subsequently, a thin film 11 containing a metal compound that is soluble with respect to a predetermined dissolution liquid is formed. For instance, the thin film 11 is formed by utilizing a compound containing WOx or MoWOx. In specific, by application of a vacuum deposition method or a sputtering method, the thin film 11 of WOx or MoWOx is formed so as to have uniform film thickness across an entire upper surface of the substrate 1.

Figure 22C:
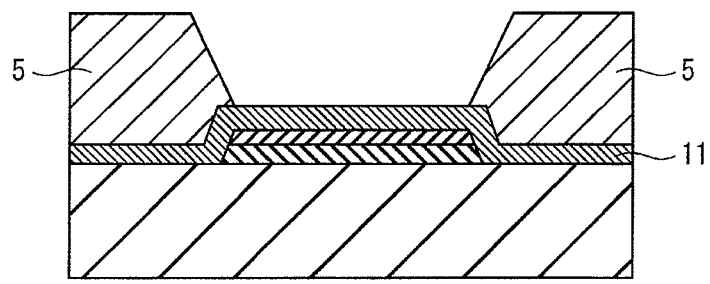

Next, as illustrated in FIG. 22C, the banks 5 are formed so as to surround each pixel region (i.e., the region at which the anode 2 is positioned), by application of, for example, photolithography. In specific, the banks 5 are formed, for example, (i) by forming, as a bank film, a resist film (for example, a resin film) including resist material as bank material on the thin film 11 by, for example, application of the resist material, (ii) forming a resist pattern on the resist film, and (iii) by removing desired portions of the resist film by etching utilizing a developing solution and thereby forming a pattern of the banks 5. Note that, when the banks 5 are formed with inorganic material, the banks 5 are formed by application of a CVD method, for example. The residuals of resist material remaining adhered on a surface of the thin film 11 after etching are removed by hydrofluoric acid, for example. Furthermore, a liquid-repellent treatment is performed with respect to the surfaces of the banks 5 as necessary.

Figure 22D:
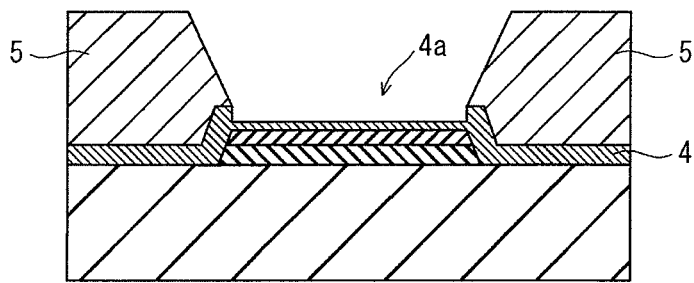

Subsequently, as illustrated in FIG. 22D, the hole injection layer 4 is formed by causing a portion of the thin film 11 to dissolve and thereby forming the recessed portion 4a. By forming the hole injection layer 4 in such a manner, the hole injection layer 4 is provided with a structure such that the region thereof defined by the banks 5 has smaller film thickness compared to other regions thereof. The forming of the recessed portion 4a is performed by, for example, causing a region of an upper surface of the thin film 11 defined by the banks 5 to dissolve with pure water during a pure water cleaning process where impurities, such as hydrofluoric acid, remaining on the surfaces of the banks 5 are removed by cleaning with pure water after the residuals of resist material have been removed. In such a case, pure water is the predetermined dissolution liquid, and it is possible to change a depth and a shape of the recessed portion 4a as necessary by changing the conditions according to which the pure water cleaning process is performed.

As for a specific method, for example, the substrate 1 is cleaned by ejecting pure water (for example, pure water at room temperature) thereon, while being kept in a rotating-state by a spin coater. Subsequently, while the substrate 1 is kept in the rotating-state, the ejection of pure water is stopped, and accordingly, the pure water is drained off from the substrate 1. In such a case, it is possible to change the depth and the shape of the recessed portion 4a by changing a time period during which pure water is ejected onto the substrate 1. In addition, since the speed at which the thin film 11 dissolves also changes according to the temperature of pure water, it is also possible to adjust the depth and the shape of the recessed portion 4a by changing the temperature of pure water ejected.

The method utilized for forming the recessed portion 4a is not limited to the above-described method. For example, the recessed portion 4a may be formed by causing a portion of the thin film 11 to dissolve to a cleaning liquid such as pure water while the residuals of resist adhering onto the surface of the thin film 11 are being removed by utilizing the cleaning liquid after the banks 5 have been formed. In such a case, the cleaning liquid is the predetermined dissolution liquid. In addition, the recessed portion 4a may be formed by causing a portion of the thin film 11 to dissolve to a developing solution while the banks 5 are formed by etching the resist film by using the developing solution and the residuals of resist adhering onto the surface of the thin film 11 are being removed by utilizing the developing solution. In such a case, the developing solution is the predetermined dissolution liquid.

When the hole injection layer 4 is formed by dissolving the thin film 11 with use of a dissolution liquid such as the cleaning liquid and the developing solution that are used in the bank forming process, the forming of the hole injection layer 4 can be performed with a high degree of efficiency since there is no need to utilize a different predetermined dissolution liquid for forming the recessed portion 4a, and further, since there is no need to perform an additional process for forming the recessed portion 4a.

Note that the recessed portion 4a is not limited to being formed by using the predetermined dissolution liquid. For instance, the recessed portion 4a may be formed by first forming a thin film made of WOx or MoWOx by sputtering and photolithography at all regions other than the region at which the anode 2 is arranged, and then forming another thin film made of WOx or MoWOx so as to cover all regions. As such, the hole injection layer 4 having a recessed shape at the region at which the anode 2 is arranged is formed.

Figure 23E:
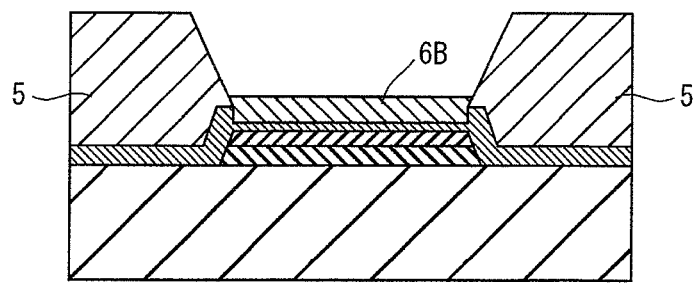
FIGS. 23E-23H each illustrate a procedure, following the procedures illustrated in FIGS. 22A-22D, in the manufacturing method of the light-emitting element pertaining to embodiment 2.

Next, as illustrated in FIG. 23E, the light-emitting layer 6B is formed by depositing drops of ink according to, for example, an inkjet method in the region defined by the banks 5, applying the ink along the inner bottom surface 4c and the inner side surface 4d of the hole injection layer 4, and then drying the ink. Note that the depositing of ink may be performed according to other methods such as a dispenser method, a nozzle coating method, a spin coating method, intaglio printing, and relief printing.

Figure 23F:
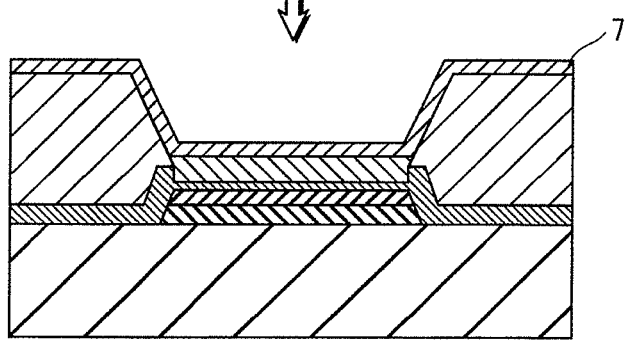
Figure 23G:
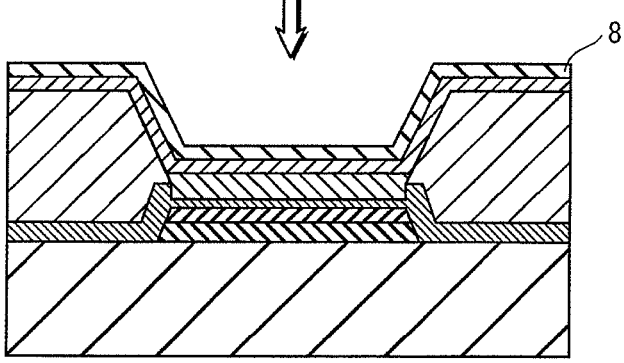
Figure 23H:
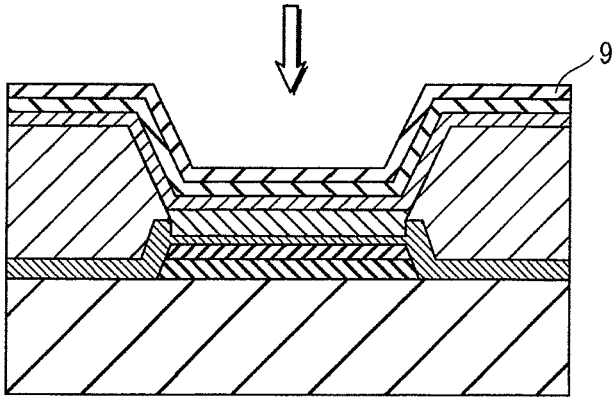

Subsequently, as illustrated in FIG. 23F, a thin film of barium, which is to become the electron injection layer 7, is formed, for example, by vacuum deposition. Then as illustrated in FIG. 23G, a thin film of ITO, which is to become the cathode 8, is formed by, for example, sputtering. Successively, as illustrated in FIG. 23H, the sealing layer 9 is formed.

<Embodiment 3>

A light-emitting element 1000D pertaining to embodiment 3 differs greatly from the light-emitting element 1000C pertaining to embodiment 2 in that the ITO layer is not formed under the hole injection layer and that a protection film is formed on the hole injection layer. In the following, description is provided while focusing on aspects differing from embodiment 2 and while simplifying or omitting description concerning aspects that are similar to embodiment 2.

(Structure of Light-emitting Element 1000D)

Figure 24:
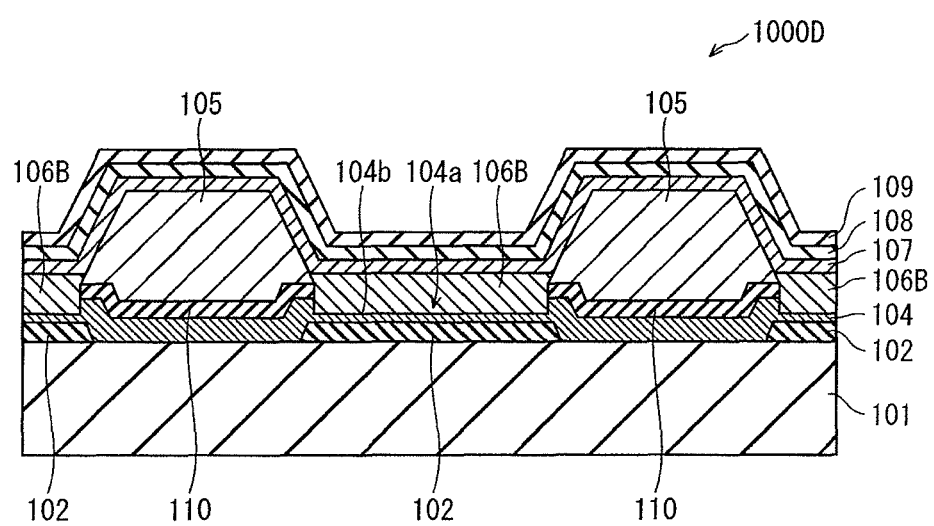
FIG. 24 is a schematic view illustrating a layered state of layers of a light-emitting element pertaining to embodiment 3 of the present disclosure.

FIG. 24 is a schematic view illustrating a layered state of layers of the light-emitting element 1000D. As illustrated in FIG. 24, the light-emitting element 1000D includes an anode 102 formed on a substrate 101, and a hole injection layer 104 and a protective layer 110 that are layered on the anode 102 in the stated order. The hole injection layer 104 functions as a charge injection transport layer. Here, note that the hole injection layer 104 is formed across the entirety of an upper surface of the substrate 101 while the protective layer 110 is not foimed above the anode 102. In addition, an ITO layer is not interposed between the anode 102 and the hole injection layer 104.

On the hole injection layer 104, banks 105 defining pixels are formed. Further, within a region defined by the banks 105, a light-emitting layer 106B is layered on the hole injection layer 104, and on the light-emitting layer 106B, an electron injection layer 107, a cathode 108, and a sealing layer 109 are formed so as to extend over the regions defined by the banks 105 to be continuous between adjacent pixels.

(Manufacturing Method of Light-Emitting Element)

Figure 25A:
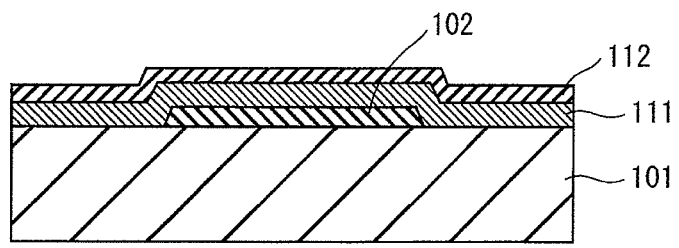
FIGS. 25A-25D each illustrate a procedure in a manufacturing method of the light-emitting element pertaining to embodiment 3 of the present disclosure.

FIGS. 25A-25D each illustrate a procedure in a manufacturing method of the light-emitting element 1000D. In the manufacturing procedures of the light-emitting element 1000D, as illustrated in FIG. 25A, first, on the substrate 101 that is made of glass, the anode 102 is formed with an aluminum-based (Al) material. Next, a thin film 111 made of WOx or MoWOx, which is to become the hole injection layer 104, is formed on the anode 102. Then a thin film 112 made of WOx or MoWOx, which is to become the protective layer 110, is formed on the thin film 111. The thin film 112 protects the hole injection layer 104 during etching for forming the banks 105.

Figure 25B:
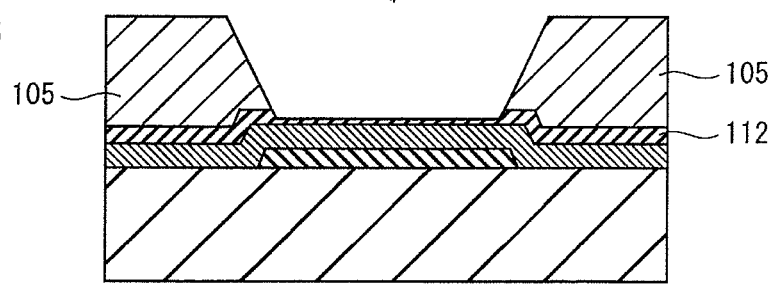

Subsequently, as illustrated in FIG. 25B, the banks 105 are formed on the thin film 112. In specific, a resist film containing resist material is formed on the thin film 112, and further, a resist pattern is formed on the resist film. Subsequently, desired portions of the resist film are removed by etching utilizing a developing solution. Accordingly, the pattern of the banks 105 is formed. Impurities such as hydrofluoric acid remaining on surfaces of the banks 105 after formation thereof are cleaned and removed by using a cleaning liquid such as pure water. However, it should be noted that a region of an upper surface of the thin film 112 defined by the banks 105 dissolves due to the cleaning liquid and thereby depresses.

Figure 25C:
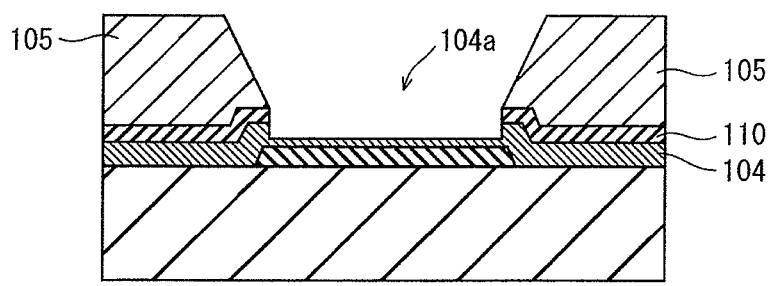

When the processing using the cleaning liquid is continued further, the region of the thin film 112 defined by the banks 105 dissolves completely until the protective layer 110 is formed as illustrated in FIG. 25C. In addition, since the thin film 111 is exposed to the outside due to the thin film 112 having dissolved, a region of an upper surface of the thin film 111 defined by the banks 105 dissolves and thereby depresses. Hence, the recessed portion 104a is formed. The hole injection layer 104 is formed in such a manner.

Figure 25D:
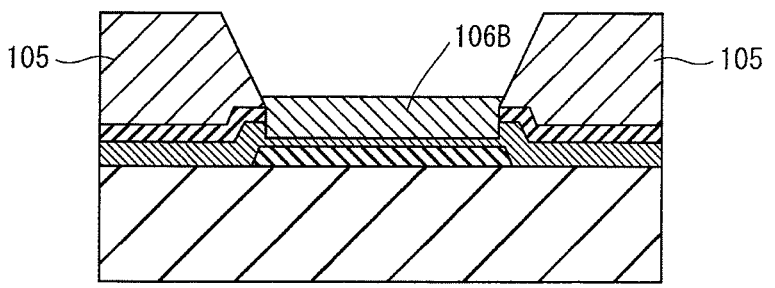

Subsequently, the light-emitting layer 106B is formed on the hole injection layer 104 within a region defined by the banks 105, as illustrated in FIG. 25D. Description on the procedures following this point is omitted since the procedures following this point are similar to the corresponding procedures in embodiment 2.

<Embodiment 4>

A light-emitting element 1000E pertaining to embodiment 4 differs greatly from the light-emitting element 1000D pertaining to embodiment 3 in terms of the region at which the hole injection layer is formed. In the following, description is provided while focusing on aspects differing from embodiment 3 and while simplifying or omitting description concerning aspects that are similar to embodiment 3.

(Structure of Light-Emitting Element)

Figure 26:
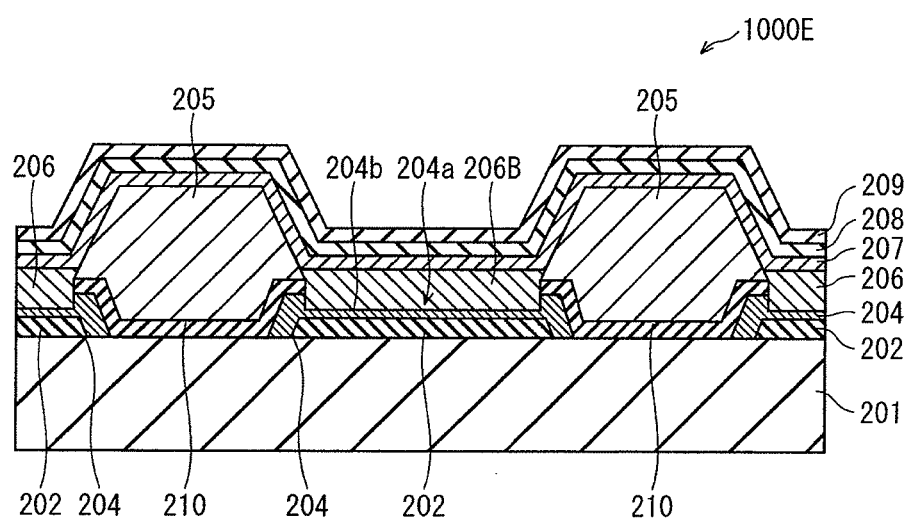
FIG. 26 is a schematic view illustrating a layered state of layers of a light-emitting element pertaining to embodiment 4 of the present disclosure.

FIG. 26 is a schematic view illustrating a layered state of layers of the light-emitting element 1000E. As illustrated in FIG. 26, the light-emitting element 1000E includes an anode 202 formed on a substrate 201, and a hole injection layer 204 and a protective layer 210 that are layered on the anode 202 in the stated order as a charge injection transport layer. Note that the hole injection layer 204 is not formed across the entirety of an upper surface of the substrate 1 but formed only on the anode 202 and at regions around the anode 202. On the other hand, the protective layer 210 is not formed above the anode 202.

On the hole injection layer 204, banks 205 defining pixels are formed. Further, within a region defined by the banks 205, a light-emitting layer 206B is layered on the hole injection layer 204, and on the light-emitting layer 206B, an electron injection layer 207, a cathode 208, and a sealing layer 209 are formed so as to extend over the regions defined by the banks 205 to be continuous between adjacent pixels.

(Manufacturing Method of Light-Emitting Element)

Figure 27A:
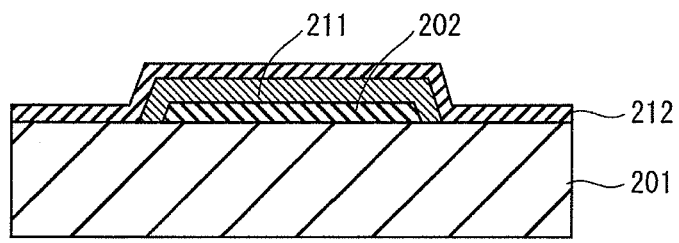
FIGS. 27A-27D each illustrate a procedure in a manufacturing method of the light-emitting element pertaining to embodiment 4 of the present disclosure.

FIGS. 27A-27D each illustrate a procedure in a manufacturing method of the light-emitting element 1000E. In the manufacturing procedures of the light-emitting element 1000E, as illustrated in FIG. 27A, first, on the substrate 101 that is made of glass, the anode 202 is formed with an aluminum-based (Al) material. Next, an oxide film 211, which is to become the hole injection layer 204, is formed by oxidizing an exposed surface (upper and side surfaces) of the anode 202. Then a thin film 212 made of WOx or MoWOx, which is to become the protective layer 210, is formed on the oxide film 211.

Figure 27B:
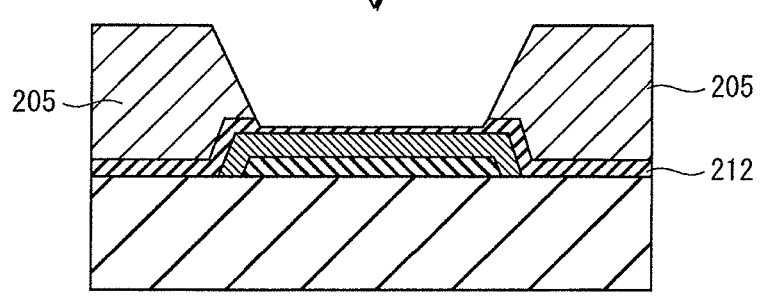

Subsequently, as illustrated in FIG. 27B, the banks 205 are formed on the thin film 212. Impurities such as hydrofluoric acid remaining on surfaces of the banks 205 after formation thereof are cleaned and removed by using a cleaning liquid such as pure water. However, it should be noted that a region of an upper surface of the thin film 212 defined by the banks 205 dissolves due to the cleaning liquid and thereby depresses.

Figure 27C:
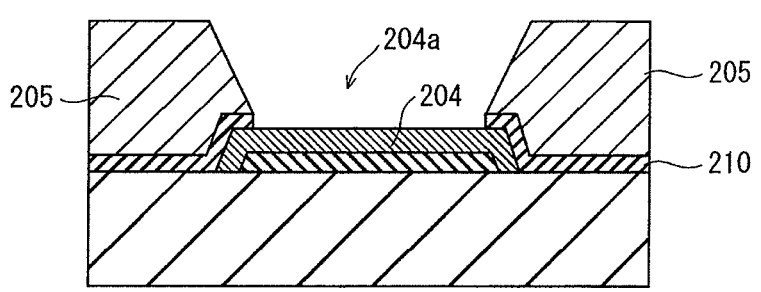

When the processing using the cleaning liquid is continued further, the region of the thin film 212 defined by the banks 205 dissolves completely and the thin film 212 is put in a final form thereof, which is the protective layer 210, as illustrated in FIG. 27C. In addition, since a region of an upper surface of the thin film 211 defined by the banks 205 is exposed to the outside due to the thin film 212 having dissolved, the region of the upper surface of the thin film 211 defined by the banks 205 dissolves and thereby depresses. Hence, a recessed portion 204a is formed. The hole injection layer 204 is formed in such a manner.

Figure 27D:
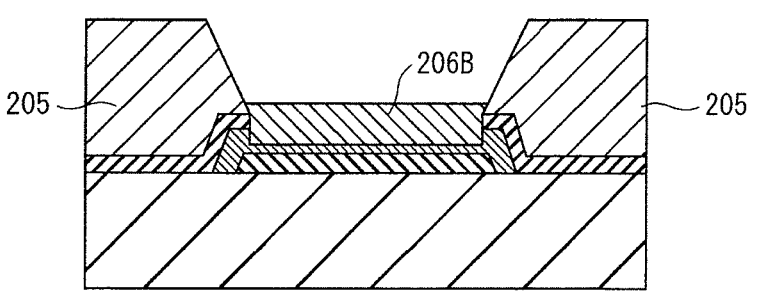

Subsequently, the light-emitting layer 206B is formed on the hole injection layer 204 within a region defined by the banks 205, as illustrated in FIG. 27D. Description on the procedures following this point is omitted since the procedures following this point are similar to the corresponding procedures in embodiment 2.

<Embodiment 5>

Figure 28:
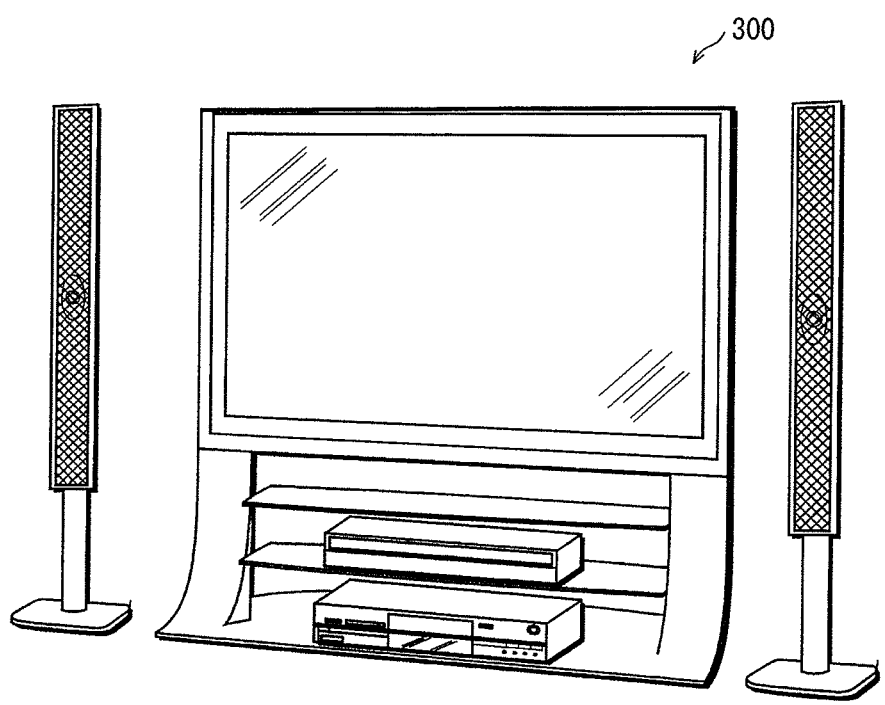

FIG. 28 is a perspective view illustrating a display apparatus pertaining to embodiment 5 and the like. As illustrated in FIG. 28, a display apparatus 300 pertaining to one aspect of the present invention is an organic EL display formed by a plurality of pixels arranged in a matrix extending in both the row direction and the column direction. Each pixel emits light of a corresponding color among the colors of R, G, and B and is composed of the light-emitting element pertaining to one aspect of the present invention.

(Modification)

Up to this point, specific explanation has been provided of the light-emitting element, the display apparatus, and the manufacturing method of the light-emitting element, each of which pertaining to one aspect of the present invention. However, it should be noted that the above-described description provided in the embodiments of the light-emitting element, the display apparatus, and the manufacturing method of the light-emitting element, each of which pertaining to one aspect of the present invention merely provides exemplary embodiments of the present invention, and therefore, the present invention should not be construed as being limited to such embodiments.

In addition, the light-emitting element pertaining to the present disclosure is not limited to a top-emission type light-emitting element, and may be a bottom-emission type light-emitting element.

(Additional Matters)

The expression "occupied energy level" as referred to in the present specification includes an energy level of a so-called semi-occupied orbital, which is an electron orbital which is occupied by at least one electron.

Further, the implementation of the organic EL element of the present disclosure is not limited to a structure where the organic EL element is used in an independent state. A plurality of the organic EL elements of the present disclosure may be integrated on a substrate as pixels to form an organic EL panel. An organic EL display so yielded may be implemented by appropriately arranging the thickness of each of the layers in each of the organic EL elements.

[Industrial Applicability]

The organic EL element pertaining to the present disclosure is to be used as display elements for mobile phone displays and TVs, and as a light source for various applications. Regardless of the specific use thereof, the organic EL element of the present disclosure is applicable as an organic EL element having a wide range of luminous intensity from low luminous intensity to high luminous intensity for the use as a light source or the like, and which can be driven at a low voltage. The organic EL element of the present disclosure, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST

1 TFT substrate
2, 102, 202 anode
3 ITO (indium tin oxide) layer
4, 104, 204 hole injection layer (tungsten oxide layer)
4a recessed portion
4c inner bottom surface of recessed portion
4d inner side surface of recessed portion
5, 105, 205 banks
5a bottom surfaces of banks
5c level of bottom surfaces of banks
5d bottom periphery of banks
6A buffer layer
6B, 106B, 206B light-emitting layer
6a bottom surface of light-emitting layer
6b side surface of light-emitting layer
7 electron transport layer
8, 108, 208 cathode
8A barium layer
8B aluminum layer
9 sealing layer
10 substrate
70 conductive silicon substrate
80 tungsten oxide layer
300 display apparatus
1000, 1000C-1000E organic EL element
1000A sample device for photoelectron spectroscopy measurement
1000B hole-only device

The invention claimed is:

1. An organic light-emitting element, comprising:
an anode;
a cathode;
banks;
a functional layer between the anode and the cathode, the functional layer including one or more sublayers, the one or more sublayers including a light-emitting sublayer, the light-emitting sublayer defined by the banks and containing an organic material; and
a hole injection layer between the anode and the functional layer, wherein
the hole injection layer comprises tungsten oxide,
the hole injection layer includes an occupied energy level that is approximately 1.8 electron volts to approximately 3.6 electron volts lower than a lowest energy level of a valence band of the hole injection layer in terms of a binding energy,
the hole injection layer has a surface facing the functional layer and has a recessed structure such that a portion of the surface overlapping with the light-emitting sublayer is located closer to the anode than other portions of the surface overlapping with the banks,
the portion of the surface overlapping with the light-emitting sublayer and the other portions of the surface overlapping with the banks are located closer to the anode than a peripheral bottom surface of each of the banks,
the recessed structure comprises an inner surface that is in contact with the functional layer, the inner surface including an inner bottom surface and an inner side surface that is continuous with the inner bottom surface, and
a film thickness of the light-emitting sublayer is uniform over the recessed structure.

2. The organic light-emitting element of claim 1, wherein the occupied energy level at an interface between the hole injection layer and the functional layer is approximately equal to an energy level of a highest occupied molecular orbital of the functional layer in terms of the binding energy.

3. The organic light-emitting element of claim 1, wherein a gap between the occupied energy level at an interface between the hole injection layer and the functional layer and an energy level of a highest occupied molecular orbital of the functional layer is at most approximately 0.3 electron volts in terms of the binding energy.

4. The organic light-emitting element of claim 1, wherein an ultraviolet photoelectron spectroscopy spectrum of the hole injection layer exhibits an upward protrusion that is approximately 1.8 electron volts to approximately 3.6 electron volts lower than the lowest energy level of the valence band in terms of the binding energy.

5. The organic light-emitting element of claim 1, wherein an X-ray photoelectron spectroscopy spectrum of the hole injection layer exhibits an upward protrusion that is approximately 1.8 electron volts to approximately 3.6 electron volts lower than the lowest energy level of the valence band in terms of the binding energy.

6. The organic light-emitting element of claim 1, wherein a differential spectrum obtained by differentiating an ultraviolet photoelectron spectroscopy spectrum of the hole injection layer has a shape that is expressed by a non-exponential function throughout a range between approximately 2.0 electron volts and approximately 3.2 electron volts lower than the lowest energy level of the valence band in terms of the binding energy.

7. The organic light-emitting element of claim 1, wherein the functional layer comprises an amine-containing material.

8. The organic light-emitting element of claim 1, wherein the functional layer further includes at least one of a hole transfer sublayer that transfers holes and a buffer sublayer that at least one of adjusts optical characteristics of the organic light-emitting element and blocks electrons.

9. The organic light-emitting element of claim 1, wherein the occupied energy level is approximately 2.0 electron volts to 3.2 electron volts lower than the lowest energy level of the valence band in terms of the binding energy.

10. The organic light-emitting element of claim 1, wherein the banks are liquid-repellent and the hole injection layer is liquid-philic.

11. A display device comprising the organic light-emitting element of claim 1.

12. A manufacturing method for an organic light-emitting element, comprising:
preparing an anode;
forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$;
forming banks above the tungsten oxide layer by forming a resist film including resist material above the tungsten oxide layer and etching the resist film with a developing solution;
forming a hole injection layer, subsequent to forming the banks, by:
cleaning, with a cleaning fluid, a surface of the tungsten oxide layer and thereby removing residuals of the resist film adhering to the surface of the tungsten oxide layer; and
dissolving a part of the tungsten oxide layer with the cleaning fluid, the hole injection layer formed such that a portion of an upper surface of the hole injection layer facing the functional layer is located closer to the anode than other portions of the upper surface overlapping with the banks, the portion forming a recessed structure comprising an inner surface that is in contact with the functional layer, the inner surface including an inner bottom surface and an inner side surface that is continuous with the inner bottom surface;
forming a functional layer by depositing ink into a region of the hole injection layer defined by the banks, applying the ink with respect to the inner bottom surface and the inner side surface such that the ink is in contact with the inner bottom surface and the inner side surface, and drying the ink; and
forming a cathode above the functional layer,
wherein the portion of the surface facing the functional layer and the other portions of the surface overlapping with the banks are located closer to the anode than a peripheral bottom surface of each of the banks.

13. A manufacturing method for an organic light-emitting element, comprising:
preparing an anode;
forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$;
forming a hole injection layer, while forming banks above the tungsten oxide layer by forming a resist film including resist material above the tungsten oxide layer and etching the resist film with a developing solution, by:
cleaning, with the developing solution, a surface of the tungsten oxide layer and thereby removing residuals of the resist film adhering to the surface of the tungsten oxide layer; and
dissolving a part of the tungsten oxide layer with the developing solution, the hole injection layer formed such that a portion of an upper surface of the hole injection layer facing the functional layer is located closer to the anode than other portions of the upper surface overlapping with the banks, the portion forming a recessed structure comprising an inner surface that is in contact with the functional layer, the inner surface including an inner bottom surface and an inner side surface that is continuous with the inner bottom surface;
forming a functional layer by depositing ink into a region of the hole injection layer defined by the banks, applying the ink with respect to the inner bottom surface and the inner side surface such that the ink is in contact with the inner bottom surface and the inner side surface, and drying the ink; and
forming a cathode above the functional layer,
wherein the portion of the surface facing the functional layer and the other portions of the surface overlapping with the banks are located closer to the anode than a peripheral bottom surface of each of the banks.

14. The manufacturing method of claim 12, wherein the tungsten oxide layer is formed such that an ultraviolet photoelectron spectroscopy spectrum of the tungsten oxide layer exhibits an upward protrusion that is approximately 1.8 electron volts to approximately 3.6 electron volts lower than a lowest energy level of a valence band of the tungsten oxide layer in terms of a binding energy.

15. The manufacturing method of claim 12, wherein the tungsten oxide layer is formed such that a differential spectrum, obtained by differentiating an ultraviolet photoelectron spectroscopy spectrum of the tungsten oxide layer, exhibits a shape that is expressed by a non-exponential function throughout a range between approximately 2.0 electron volts and approximately 3.2 electron volts lower than a lowest energy level of a valence band of the tungsten oxide layer in terms of a binding energy.

16. The organic light-emitting element of claim 1, wherein the surface of the hole injection layer which faces the functional layer and which includes the portion and the other portions is located closer to the anode in level than each bottom surface of the banks.

17. The organic light-emitting element of claim 1, wherein a film thickness of the hole injection layer in a region defined by the recessed structure is smaller than a film thickness in other regions, and the film thickness in the other regions is uniform.

18. The organic light-emitting element of claim 1, wherein the recessed structure extends under the peripheral bottom surface of at least one of the banks.

19. The An organic light-emitting element of claim 1, comprising:
an anode;
a cathode;
banks;
a functional layer between the anode and the cathode, the functional layer including one or more sublayers, the one or more sublayers including a light-emitting sublayer, the light-emitting sublayer defined by the banks and containing an organic material; and
a hole injection layer between the anode and the functional layer, wherein
the hole injection layer comprises tungsten oxide,
the hole injection layer includes an occupied energy level that is approximately 1.8 electron volts to approximately 3.6 electron volts lower than a lowest energy level of a valence band of the hole injection layer in terms of a binding energy,
the hole injection layer has a surface facing the functional layer and has a recessed structure such that a portion of the surface overlapping with the light-emitting sublayer is located closer to the anode than other portions of the surface overlapping with the banks,
the portion of the surface overlapping with the light-emitting sublayer and the other portions of the surface overlapping with the banks are located closer to the anode than a peripheral bottom surface of each of the banks,
the recessed structure comprises an inner surface that is in contact with the functional layer, the inner surface including an inner bottom surface and an inner side surface that is continuous with the inner bottom surface, and
the hole injection layer is composed of tungsten oxide WO$_x$ in which x is a real number greater than 2 and less than 3.

* * * * *